(12) United States Patent
Kuznetsov

(10) Patent No.: US 9,667,232 B2
(45) Date of Patent: May 30, 2017

(54) SYSTEM AND METHOD FOR PARALLEL CONFIGURATION OF HYBRID ENERGY STORAGE MODULE

(71) Applicant: RAYTHEON COMPANY, Waltham, MA (US)

(72) Inventor: Stephen B. Kuznetsov, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 179 days.

(21) Appl. No.: 14/711,632

(22) Filed: May 13, 2015

(65) Prior Publication Data

US 2016/0336928 A1 Nov. 17, 2016

(51) Int. Cl.
  *H02J 15/00* (2006.01)
  *H03K 3/53* (2006.01)
  *H03K 5/00* (2006.01)

(52) U.S. Cl.
  CPC .............. *H03K 3/53* (2013.01); *H02J 15/00* (2013.01); *H03K 5/00* (2013.01)

(58) Field of Classification Search
  CPC ............. H02J 15/00; H03K 5/00; H03K 5/53
  USPC ........................................................ 307/47
  See application file for complete search history.

(56) References Cited

U.S. PATENT DOCUMENTS

| | | |
|---|---|---|
| 1,646,823 A | 10/1927 | Karapetoff |
| 2,149,082 A | 2/1939 | Buell et al. |
| 2,740,510 A | 4/1956 | Berthold |
| 3,024,298 A | 7/1958 | Goltsos et al. |
| 3,004,381 A | 10/1961 | Schweitzer |
| 3,183,431 A | 5/1965 | Ford |
| 3,187,250 A | 6/1965 | Born et al. |
| 3,315,148 A | 4/1967 | Grillo |
| 3,452,229 A | 6/1969 | Pimlott et al. |
| 3,571,693 A | 3/1971 | Riaz |

(Continued)

FOREIGN PATENT DOCUMENTS

| | | |
|---|---|---|
| EP | 0849170 | 6/1998 |
| WO | 02061910 A2 | 8/2002 |

OTHER PUBLICATIONS

Kuznetsov, S.; U.S. Patent Application entitled "Electro-Mechanical Kinetic Energy Storage Device and Method of Operation" U.S. Appl. No. 13/458,586, filed Apr. 27, 2012, 38 pgs.

(Continued)

*Primary Examiner* — Robert Deberadinis

(57) ABSTRACT

A hybrid energy storage system is configured to control pulsed power. A first dynamo-electric machine is coupled to an inertial energy storage device and has multiple input stator windings configured to accept input power from a source. A polyphase output stator winding is configured to deliver electric power having a first response time to a DC bus. A secondary energy storage system is coupled to the DC bus and is configured to convert its stored energy to electric power in a bidirectional manner. A second dynamo-electric machine has an input stator winding and at least one polyphase output stator winding coupled to a converter, the converter coupled to a DC output. A polyphase boost exciter is configured to derive energy from the DC bus and excite the second machine tertiary stator winding, wherein the second machine is configured to be excited at a faster rate than the first response time of the first machine.

21 Claims, 18 Drawing Sheets

(56) References Cited

U.S. PATENT DOCUMENTS

| | | | |
|---|---|---|---|
| 3,667,012 | A | 5/1972 | Kilgore |
| 4,001,666 | A | 1/1977 | Grenfell |
| 4,011,535 | A | 3/1977 | Kosky et al. |
| 4,048,603 | A | 9/1977 | Staub et al. |
| 4,393,964 | A | 7/1983 | Kemper |
| 4,439,720 | A | 3/1984 | Georges |
| 4,444,444 | A | 4/1984 | Benedetti et al. |
| 4,612,494 | A | 9/1986 | Kawamura |
| 4,926,107 | A | 5/1990 | Pinson |
| 4,971,522 | A | 11/1990 | Butlin |
| 5,097,194 | A | 3/1992 | Walton et al. |
| 5,646,458 | A | 7/1997 | Bowyer et al. |
| 5,921,505 | A | 7/1999 | Spector |
| 6,023,152 | A | 2/2000 | Briest et al. |
| 6,078,119 | A | 6/2000 | Satoh et al. |
| 6,161,495 | A | 12/2000 | Ambs |
| 6,239,513 | B1 | 5/2001 | Dean et al. |
| 6,573,626 | B1 | 6/2003 | Gosebruch et al. |
| 6,710,579 | B2 | 3/2004 | Ebel et al. |
| 7,663,328 | B2 | 2/2010 | Gonder |
| 7,710,081 | B2 | 5/2010 | Saban et al. |
| 2005/0012395 | A1 | 1/2005 | Eckroad et al. |
| 2008/0103632 | A1 | 5/2008 | Saban et al. |
| 2009/0134705 | A1 | 5/2009 | Kalev |
| 2011/0084568 | A1 | 4/2011 | Lateb et al. |
| 2012/0187922 | A1 | 7/2012 | Dubois et al. |
| 2012/0286523 | A1 | 11/2012 | Hull et al. |
| 2013/0020893 | A1 | 1/2013 | Bradley et al. |
| 2013/0127391 | A1 | 5/2013 | Lewis |
| 2013/0257186 | A1 | 10/2013 | Kozar et al. |
| 2013/0260999 | A1 | 10/2013 | Hull et al. |
| 2013/0261001 | A1 | 10/2013 | Hull et al. |
| 2013/0285491 | A1 | 10/2013 | Kuznetsov |
| 2014/0346868 | A1 | 11/2014 | Kuznetsov |

OTHER PUBLICATIONS

Kuznetsov, S.; U.S. Patent Application entitled "Inertial Energy Storage System and Hydro-Fluoro-Ether Power Transformer Scheme for Radar Power Systems and Large PFN Charging"; U.S. Appl. No. 14/245,754, filed Apr. 4, 2014; 54 pages.

Kuznetsov, S.; U.S. Patent Application entitled "Method and Apparatus for Control of Pulsed Power in Hybrid Energy Storage Module"; U.S. Appl. No. 14/591,695; filed Jan. 7, 2015; 47 pages.

International Search Report and Written Opinion issued for PCT/US2016/012513, dated May 30, 2016, 11 pgs.

L.A. Kilgore et al., "Energy Storage at Site Permits Use of Large Excavators on Small Power Systems", Westinghouse Engineer, Nov. 1970, vol. 30 No. 6, pp. 162-167.

Limpaecher, et al. "Resonant Link PFN Charger and Modular Power Supply" Science Application International Corporation Electrical Power Technology Division, IEEE, 2007; pp. 1495-1499.

Walls, W.A., "Rotating machines for pulsed power", IEEE Xplore Abstract, Conference Record of the 25th International Symposium and 2002 High-voltage Workshop, Jun. 30-Jul. 3, 2002, 8 pages, IEEE, New York, N.Y.

3M Electronics, Product Information, "3M Novec 649 Engineered Fluid", <URL: http://solutions.3mmagyar.hu/3MContentRetrievalAPI/BlobServlet?lmd=1351678101000&locale=hu_HU&assetType=MMM_Image&assetId=19241050803&blobAttribute=ImageFile>, Sep. 9, 2009, 4 pages.

International Search Report and Written Opinion issued for PCT/US2015/017264, dated Sep. 2, 2015, 5 pgs.

Mike Strasik, "Flywheel Electricity Systems with Supercoducting Bearings for Utility Applications," Boeing Phantom Works, Jul. 28, 2004, 32 pages.

Kuznetsov, S.; U.S. Patent Application entitled "Inertial Energy Storage System and Hydro-Fluoro-Ether Power Transformer Scheme for Radar Power Systems and Large PFN Charging"; U.S. Appl. No. 14/245,754; filed Apr. 4, 2014; 54 pages.

Kuznetsov, S.; U.S. Patent Application entitled "Method and Apparatus for Control of Pulsed Power in Hybrid energy storage module"; U.S. Appl. No. 14/591,695, filed Jan. 7, 2015; 47 pages.

Moore, et al.; "Design and Performance Characteristics of Gas/Vapor Transformers"; Trans. IEEE; Power Apparatus & Systems; vol. PAS-101; Jul. 1982; 4 pages.

Narbut, et al.; "Vaporization Cooling for Power Transformers" Transaction of the AIEE; Power Apparatus & Systems, Part III; Dec. 1959; 7 pages.

Notification of Transmittal of the International Search Report and the Written Opinion of the International Searching Authority in PCT/US2016/032161 dated Mar. 9, 2017, 11 pages.

SYSTEM AND METHOD FOR PARALLEL CONFIGURATION OF HYBRID ENERGY STORAGE MODULE

GOVERNMENT LICENSE RIGHTS

This invention was made with Government support under Contract No. N00014-14-C-0083 awarded by the Department of the Navy. The Government has certain rights in the invention.

TECHNICAL FIELD

The present disclosure is directed pulsed power systems at the megawatt level and gigawatt level, and more particularly to hybrid energy storage system for large pulse forming network (PFN) charging or operating pulsating loads.

BACKGROUND OF THE DISCLOSURE

Large scale energy storage involves several different mechanisms of energy storage which differ in application by how fast and how frequently each subsystem can absorb or deliver energy. Conventional systems are inadequate for transferring large blocks of energy from slow response sources to fast response loads or fast intermediate loads, and recovering energy from pulsed power loads to either intermediate response sources or to an AC source.

Energy storage and pulsed power at the megawatt and gigawatt level require new topologies for the magnetics of the transformer and the electrical machinery, as well as enhanced cooling to reduce component critical temperatures, extend lifetime and allow faster repetition rates for an effector. High-voltage Direct Current (HVDC) outputs are useful to power pulsed loads, and low-voltage Direct Current (LVDC) outputs are useful to power radar and lower power pulse forming network (PFN) loads. The combination of an electro-chemical energy source with an inertial energy source allows for a fast response system which can accommodate both high energy loads and high average power loads and provide multiple voltage levels of output.

SUMMARY OF THE DISCLOSURE

To address one or more of the above-deficiencies of the prior art, one embodiment described in this disclosure provides hybrid energy storage module (HESM) as a major subsystem for large pulse forming network (PFN) charging or operating pulsating loads.

According to one example embodiment of the disclosure, a system includes an inertial and electro-chemical combined energy storage system. The system also includes a first dynamo-electric machine configured to act as a prime mover and electrically coupled to a second dynamo-electric machine through an electrical reactor. The first dynamo-electric machine has output stator windings configured to produce AC power, a rotor winding configured to be excited by an exciter, and at least one polyphase output stator winding with or without rectification to deliver electric power at a first rate to a bus. The system also includes a secondary energy storage system coupled to the bus and configured to exchange electrical energy in a bidirectional manner. The system also includes a second dynamo-electric machine coupled to the inertial energy storage device and third electrical machine and configured to impart kinetic energy to the inertial storage device. The second dynamo-electric machine has a multi-port stator winding and a wound-rotor with a polyphase winding for excitation, and at least one polyphase output stator winding coupled to an AC/DC power converter. The power converter is coupled to a DC output configured to couple to a pulsed load device. The system further includes a polyphase boost exciter configured to derive energy from either an AC or DC bus and excite the second dynamo-electric machine tertiary stator winding, wherein the second dynamo-electric machine is configured to be electronically excited at a second rate that is faster than the first rate for the purpose of feeding loads with fast rise times or having rapidly changing terminal impedances.

In another example embodiment, a system includes a flywheel. The system also includes a first dynamo-electric machine configured to act as a prime mover and electrically coupled to a second dynamo-electric machine through an electrical reactor. The first dynamo-electric machine has output stator windings configured to produce AC power, a rotor winding configured to be excited by an exciter, and at least one polyphase output stator winding with or without rectification to deliver electric power at a first rate to a bus. The system also includes an electro-chemical battery energy storage system coupled to the bus and configured to exchange electrical energy in a bidirectional manner. The system also includes a second dynamo-electric machine coupled to the flywheel and third electrical machine and configured to impart kinetic energy to the flywheel. The second dynamo-electric machine has a multi-port stator winding and a wound-rotor with a polyphase winding for excitation, and at least one polyphase output stator winding coupled to an AC/DC power converter. The power converter is coupled to a DC output configured to couple to a pulsed load device. The system further includes a polyphase boost exciter configured to derive energy from either an AC or DC bus and excite the second dynamo-electric machine tertiary stator winding, wherein the second dynamo-electric machine is configured to be electronically excited at a second rate that is faster than the first rate for the purpose of feeding loads with fast rise times or having rapidly changing terminal impedances.

In another example embodiment, a method includes storing energy in an inertial and electro-chemical combined energy storage system. The method also includes producing a AC power by output stator windings of a first dynamo-electric machine. The first dynamo-electric machine acting as a prime mover and electrically coupled to a second dynamo-electric machine through an electrical reactor, and having a rotor winding configured to be excited by an exciter, and having at least one polyphase output stator winding with or without rectification to deliver electric power at a first rate to a bus. The method also includes storing, in an electro-chemical battery energy storage system coupled to the bus and configured to exchange electrical energy in a bidirectional manner. The method also includes imparting kinetic energy to the flywheel by a second dynamo-electric machine coupled to the flywheel and third electrical machine. The second dynamo-electric machine having a multi-port stator winding and a wound-rotor with a polyphase winding for excitation, and at least one polyphase output stator winding coupled to an AC/DC power converter, the power converter coupled to a DC output configured to couple to a pulsed load device. The method includes deriving energy, by a polyphase boost exciter, from either an AC or DC bus and exciting the second dynamo-electric machine tertiary stator winding, wherein the second dynamo-electric machine is configured to be electronically excited at a second rate that is faster than the first rate for the purpose of feeding loads with fast rise times or having rapidly changing terminal impedances.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
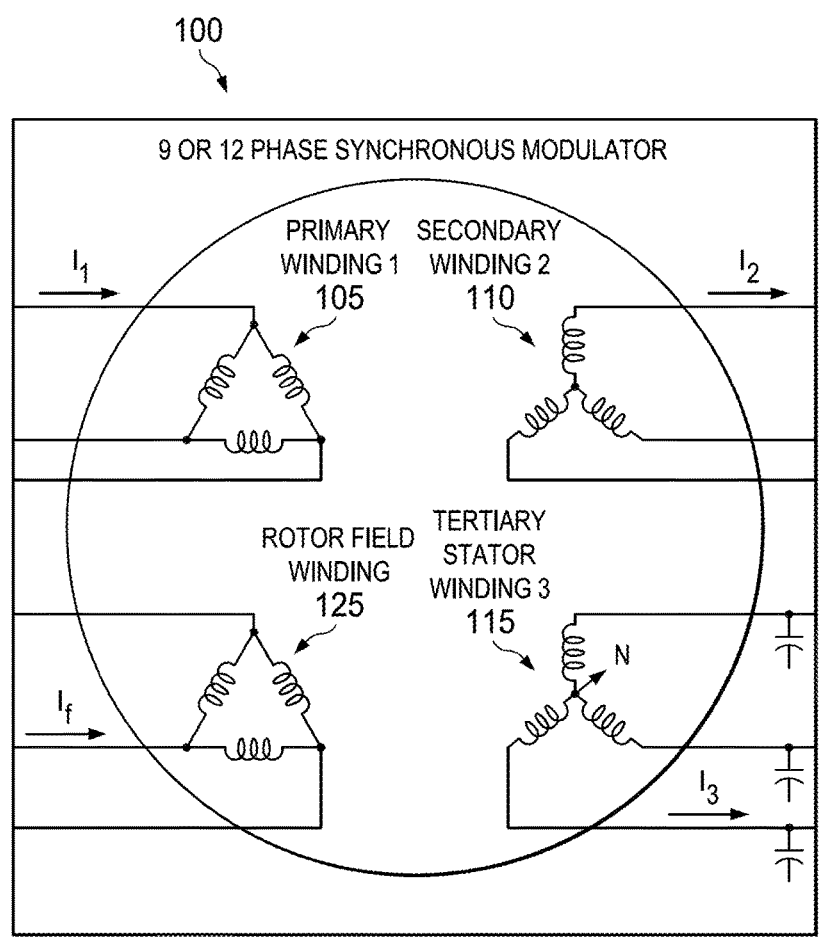
FIG. 1 illustrates a Doubly Fed Induction Machine (DFIM) according to this disclosure.

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

This disclosure solves a basic problem of transferring large blocks of energy from slow response sources to fast response loads or fast intermediate loads, and isolates pulsed power from generator sources. Specific embodiments are shown that isolate a main electrical bus from a pulse load bus and buffers or charges an energy storage device. The multi-port electrical machinery is fully integrated with an inertial storage unit and an electro-chemical energy storage set with special application to pulse power fast-rise time loads.

Certain mobile platforms, such as seafaring ships or other vessels, craft or vehicles, have turbine generators (turbine gen-set) that are designed to handle steady-state loads and that require a transient loading to be kept under 10%. Future systems will take an existing megawatt (MW) power system up to either 150% or 300% capacity to operate continuous pulsed power loads that may be as high as 75% of total installed capacity. An energy storage system is needed that will shave peaks off of transient loads and protect the turbine-gen set for repeated-rate (rep-rate) operation while allowing for the continued operation of other electrical loads, such as to be operational at approximately 50% of the turbine-generator capacity, with minimal impact on power system.

The use of a synchronous modulator electrical machine, coupled to an electro-chemical (battery) energy source provides a buffer to the battery for high charging rates associated with large energy recovery or fast charging. Certain embodiments of the present disclosure provide a new system topology that places a synchronous modulator in the form of a doubly-excited induction/synchronous machine directly on an electrical bus, such as a main ship electrical bus, but with special equipment and special machine characteristics to limit the surge of pulsed power from the main turbine generators.

Certain embodiments of the present disclosure prove an integrated system of inertial and large scale battery energy storage for naval ships with new application of high power electromagnetic effectors for ships in Directed Energy Power System (DEPS). In certain embodiments, a High Energy Storage Module (HESM) supports continuous load operations of large scale and medium scale pulsed power effectors in a parallel electrical configuration with conventional ship turbine generators. In certain embodiments, a "Synchronous Modulator" System allows HESM to buffer the turbine generators from large pulse loadings (mechanical damage) and also buffers large lithium batteries against severe overheating due to high charge and recharge rates or high DEPS rep-rate. Certain embodiments allow 1 millisecond (ms) response time and dynamic stability for large blocks of pulsed power that may be required for pulsed loads. Certain embodiments provide a direct interface of the HESM on a medium voltage Alternating Current (AC) or Direct Current (DC) system. Certain embodiments eliminate approximately 100 tons of heavy transformers & controlled rectifiers or converters by use of HESM. In certain embodiments, use of the "Synchronous Modulator" HESM improves system dynamic stability for rapidly changing load profiles.

FIG. 1 illustrates a Doubly Fed Induction Machine (DFIM) 100 according to this disclosure. The embodiment of the DFIM 100 shown in FIG. 1 is for illustration only. Other embodiments could be used without departing from the scope of the present disclosure.

The DFIM 100 includes a 9-phase or 12-phase input winding 105 (3-phase shown for simplicity) and two secondary output winding groups S1 110 and S2 115 constituting a 3-port Synchronous Motor (SM) coupled to flywheel energy storage unit. The DFIM 100 includes multiple stator output and input windings with multiple voltage classes and multiple time constants. The primary windings 105 are fed from an AC source. The secondary winding S2 110 feeds a high voltage (HV) pulse load with time constant T1 and tertiary winding (S3) 115 feeds a second electrical load with time constant T2, on two distinct pulsed power busses 120. The DFIM 100 has conventional rotor field DC and AC polyphase excitation provided by rotor winding 125 for powering steady state or moderate rise-time pulsating loads.

Figure 2:
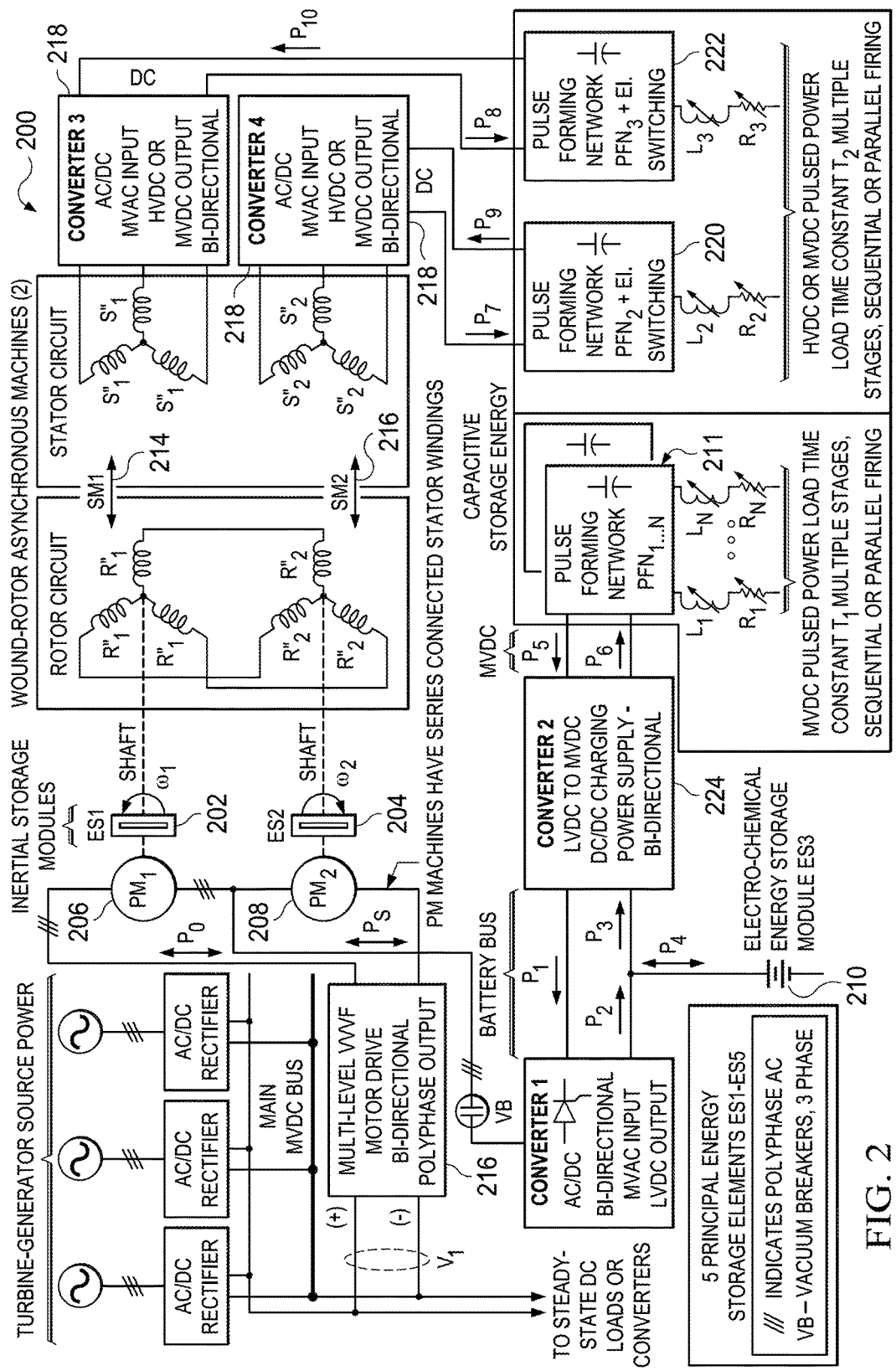
FIG. 2 illustrates a system including dual synchronous modulators with two different types of pulsed power loads and rotating machinery with dual stators driving independent HVDC or MVDC pulse forming networks as loads according to this disclosure.

FIG. 2 illustrates a system 200 including dual synchronous modulators with two different types of pulsed power loads and rotating machinery dual stators driving independent HVDC or Medium Voltage DC (MVDC) pulse forming networks as loads according to this disclosure. The embodiment of the system 200 shown in FIG. 2 is for illustration only. Other embodiments could be used without departing from the scope of the present disclosure. It should be evident to one skilled in the art that the arrangement described in FIG. 2 constitutes a practical system whereby very high energy storage is required.

FIG. 2 shows a means and apparatus for utilizing a dual synchronous modulator fully regenerative system to feed and control pulsed power loads with two or more significantly different time constants and five (5) principal sources of stored energy as follows: two inertial storage modules, ES1 202, ES2 204, controlled by permanent magnet (PM) input drive motors PM1 206 and PM2 208 respectively; one electrochemical storage module ES3 210 on the main LVDC bus; one energy storage capacitive module ES4 integral to the Pulse Forming Network-1 (PFN1) 211; and one energy storage capacitive module ES5 integral to the PFN2 220.

The system 200 comprises balanced wound-rotor output electrical machines with two principal pulsed power outputs of different time constants and five energy storage units. A multi-level variable voltage variable frequency (VVVF) motor drive 212 feeds the two main drive motors PM1 206 and PM2 208 arranged in a series stator connection to yield equal stator currents and have balanced torque. Permanent magnet motor PM1 206 is connected to ES1 202 inertial/flywheel unit and is on the same shaft as the wound 3-phase rotor from the synchronous modulator SM1 214. The stator from the SM1 214 is operating at a frequency independent of the main motor drive frequency but linearly related to the shaft speed. In certain embodiments, the rotor circuit of SM1 214 is directly connected to the rotor circuit of synchronous modulator SM2 216. The rotor of SM2 216 is directly coupled to the ES2 204 inertial storage unit and to the permanent magnet motor PM2 208. The shaft of SM1 214 is arranged to turn counterclockwise to the rotation of the shaft for SM2 216, and in so doing, this results in minimal net torsional torque on the baseplate and overall system since machines SM1 214 and SM2 216 may be co-located.

System 200 separates the synchronous modulator outputs into two identical power paths feeding two identical AC-to-DC converters 218, which are voltage boost converters, and in certain embodiments, produce high voltage DC (HVDC) power P7 and P8 going to two or more PFN master modules PFN2 220 and PFN3 222. PFN2 220 and PFN3 223 can be further subdivided into smaller PFN sub-modules, which are sequentially or parallel fired. The sequential firing produces the output waveforms of most interest. In this arrangement, PFN2 220 can be fired first followed by PFN3 222 firing, then alternating back and forth between these PFN groups to balance the overall energy transfer from storage system of ES1 202 and ES2 204 with minimal power being drawn from the MVDC input power source. Reverse power flow directions for P9 and P10, the electrical machinery and AC/DC Converters 1&2, as well as incoming power Po, indicate the system is fully bidirectional, and can recover unused PFN energy and return this to inertial storage ES1 202 and ES2 204.

Electrical balance between the two system halves SM1 214 and SM2 216 is maintained due to the rotor circuits being directly connected, which share a common electrical frequency despite slight differences in shaft speeds. Auxiliary excitation apparatus 228 feeds both wound rotors with identical polyphase variable frequency excitation to precisely control output voltage. Certain embodiments for the AC/DC converters 1, 3 & 4 are a thyristor or an insulated-gate bipolar transistor (IGBT) controlled dual bridge rectifiers with means for regenerative energy flow. Converter 2 224 is a DC-DC type whereby a step-up in DC level is provided by a set of step-up medium frequency transformers followed by full wave rectification. Converters (3 and 4) 218 have the ability to provide HVDC output at voltages, such as of 5 kV to 100 kV with existing state of the art thyristor or IGBT switching device stacks. Alternate embodiments include IGBT switching devices and a multi-level output winding for both SM1 214 and SM2 216, whereby the output power converters are arranged in series-aiding and fed from a 6-phase, 9-phase, 12-phase or 15-phase stator winding arranged in separate groups of 2, 3, 4, or 5 sets of isolated 3-phase windings. The apparatus of FIG. 2 provides a means of powering PFN1 211 of principal time constant T1 simultaneously with powering PFN2 220 or PFN3 222 of principal time constant T2 and at a higher voltage or power level with a different impedance level.

Figure 3:
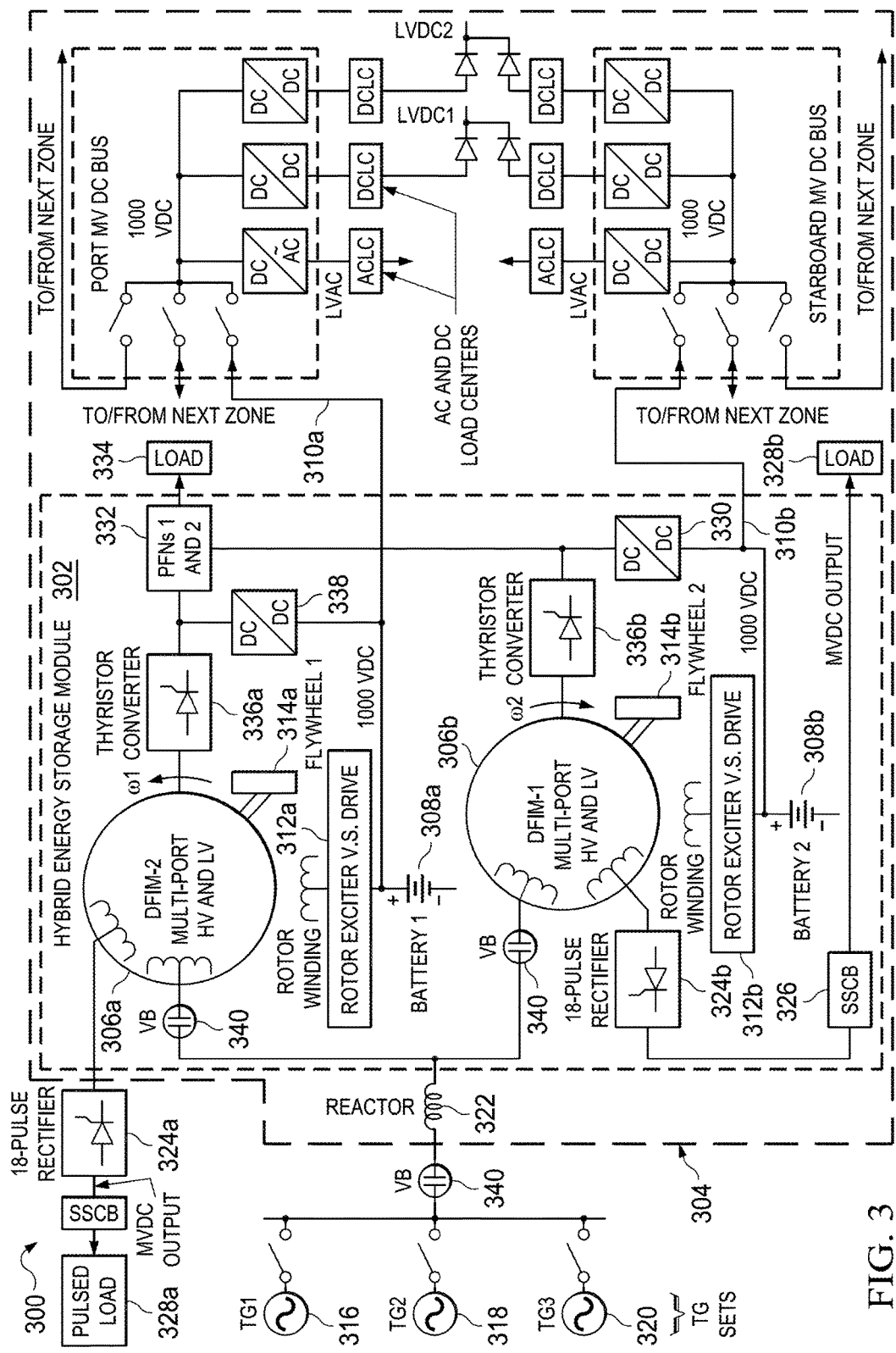
FIG. 3 illustrates an electrical generation and distribution system including a HESM parallel configuration system according to this disclosure.

FIG. 3 illustrates an electrical generation and distribution system 300 including a HESM parallel configuration system according to this disclosure. The embodiment of the system 300 shown in FIG. 3 is for illustration only. Other embodiments could be used without departing from the scope of the present disclosure.

The HESM 302 is coupled to an existing electrical architecture (EM) 304, such as a ship's parallel electrical distribution or zonal system. The HESM 302 includes Doubly Fed Induction Machines (DFIM), such as a first DFIM (DFIM-1) 306a, a second DFIM (DFIM-2) 306b, a first battery (battery-1) 308a and a second battery (battery-2) 308b. Battery-1 308a provides a first voltage, such as 1000 Volts DC (VDC) to a first bus 310a, or first zone, and battery-2 308b provides a second voltage, which can also be 1000 Volts DC (VDC), to a second bus 310b, or second zone. Although the first voltage is shown to be equal to the second voltage, the voltages can be different and each voltage can be at different values. The first bus 310a and the second bus 310b facilitate the transfer of power both ways, that is, from the battery to the respective zones and from the respective zones to the battery.

The DFIM-1 306a and the DFIM-2 306b are each multi-port machines. The DFIM-1 306a includes a rotor driven by a variable speed (V.S.) drive 312a at low frequency, which is coupled between the battery-1 308a and the DFIM-1 306a. The V.S. drive 312a draws power from the battery-1 308a to excite the rotor of the DFIM-1 306a. The DFIM-2 306b includes a rotor driven by a V.S. drive 312b at low frequency, which is coupled between the battery-2 308b and the DFIM-2 306b. The V.S. drive 312b draws power from the battery-2 308b to excite the rotor of the DFIM-2 306b. The rotors are three-phase (3φ). The DFIM-1 306a also is coupled to a first flywheel 314a and able to extract energy from the first flywheel 314a. The DFIM-2 306b also is coupled to a second flywheel 314b and able to extract energy from the second flywheel 314b.

Certain embodiments provide a stable power at an output of the stator and, as such, avoid a requirement to power condition an output of the stator and eliminate a need for a full converter for power out at the stator. The HESM parallel configuration system 302 enables a running of the rotors at variable speed and at inverse proportion to the flywheel speed, from which energy is extracted. According to embodiments of the present disclosure, stator frequency is maintained, such as at 60 Hertz (Hz), even though rotor speed varies while still extracting energy at the rotor. For example, stator frequency can be maintained at 60 Hz even though rotor speed is reducing from a first speed, such as 3600 revolutions per minute (rpm) to a second speed, such as 2000 rpm, while still extracting energy at the rotor by boosting of the rotor electrical frequency.

The HESM 302 couples to turbine generators, TG1 316, TG2 318 and TG3 320, through a reactor 322. The reactor 322 separates steady state operation of the turbine generators, TG1 316, TG2 318 and TG3 320, from the pulse use of the DFIM-1 306a and DFIM-2 306b.

The second port of the stator of the DFIM-2 306b is coupled to rectifier 324b, such as a 2.5 megawatt (MW) 18-pulse rectifier. The rectifier 324b further is coupled through a solid state circuit breaker (SSCB) 326 along a pulsed power line to a second pulse load 328, such as a another type of pulsed electrical load. The second winding, that is, the second port, of the DFIM-2 306b, can deliver a second voltage that is different from a main voltage of the EM 304. For example, the second winding of the DFIM-2 306b can be set to 4800 VAC while the EM 304 has a polyphase voltage of 4160 VAC or 450 VAC. The voltage from the second winding of the DFIM-2 306b can be stepped up or down for certain loads, such as up to 6.5 kV or 600 VDC. The DFIM-2 306b includes galvanic isolation between the primary windings, which is coupled to the turbine generators through the reactor 322, and the second winding. The battery-2 308b is coupled to a DC-DC converter 330 to deliver power in a constant-current mode to a PFN 332. The PFN 332 delivers electrical energy along a pulsed power line to a first pulse load 334, such as a railgun, or another type of pulsed electrical load. The DFIM-2 306b draws power from the generators to recharge one or more of the second flywheel 314b or the battery-2 308b.

The second port of the stator of the DFIM-1 306a is coupled to rectifier 336, such as a 10 MW rectifier, which is principally operated in a constant power mode. The rectifier 336 further is coupled to the PFN 332. The second winding, that is, the second port, of the DFIM-1 306a, can deliver a first voltage that is different from a main voltage of the EM 304. For example, the second winding of the DFIM-2 306a can be set to 6600 VAC while the EM 304 has a voltage of 4160 VAC or 450 VAC, and rectified by rectifier 324a to feed a pulsating load 328a. The voltage from the second winding of the DFIM-1 306a can be stepped up or down for certain loads, such as up to 6.5 kV or 1000 VDC after rectification. The DFIM-1 306a includes galvanic isolation between the primary winding, which is coupled to the turbine generators through the reactor 322, and the second winding. The battery-1 308a is coupled to a DC-DC converter 338 to deliver power in a constant power mode to a PFN 332. The PFN 332 delivers electrical energy along a pulsed power line to a first pulse load 334, such as a railgun, or another type of pulsed electrical load. The DFIM-1 306a draws power from the generators to recharge one or more of the first flywheel 314a or the battery-1 308a.

The second pulse load 328b can operate, drawing power from the second flywheel 314b or the battery-2 308b, or both. For example, the SSCB 326 can close to provide power to the second pulse load 328b, the second flywheel 314b can spin and discharge to about 70% while the second pulse load 328b operates; then the SSCB 326 opens and the second flywheel 314b recharges via the DFIM-2 306b primary winding connection to the generators. This minimizes a disturbance on the main bus, for example a ship bus system operating at 450 VAC or 4160 VAC, or both.

In a first power interval, the PFNs 332 draws a constant current charge from the battery-1 308a and battery-2 308b. The constant current can be delivered by the batteries for a high rate charging period. The charging period can include a range of time between one second and three seconds. The PFNs 332 receives a constant power from the DFIMs during a second power interval. The power interval can include a range of time between three seconds and twenty seconds. The PFNs can deliver power to the first pulsed load 334 rapidly, such as once every X seconds, where X is, by example, within a range from four to twenty seconds.

The DFIM-1 306a and the DFIM-2 306b are further isolated from the turbine generators, TG1 316, TG2 318 and TG3 320, by a number of vacuum breakers (VB) 340. The VBs 340 are disposed between the turbine generators and the reactor 322 and between the reactor 322 and each DFIM.

Figure 4:
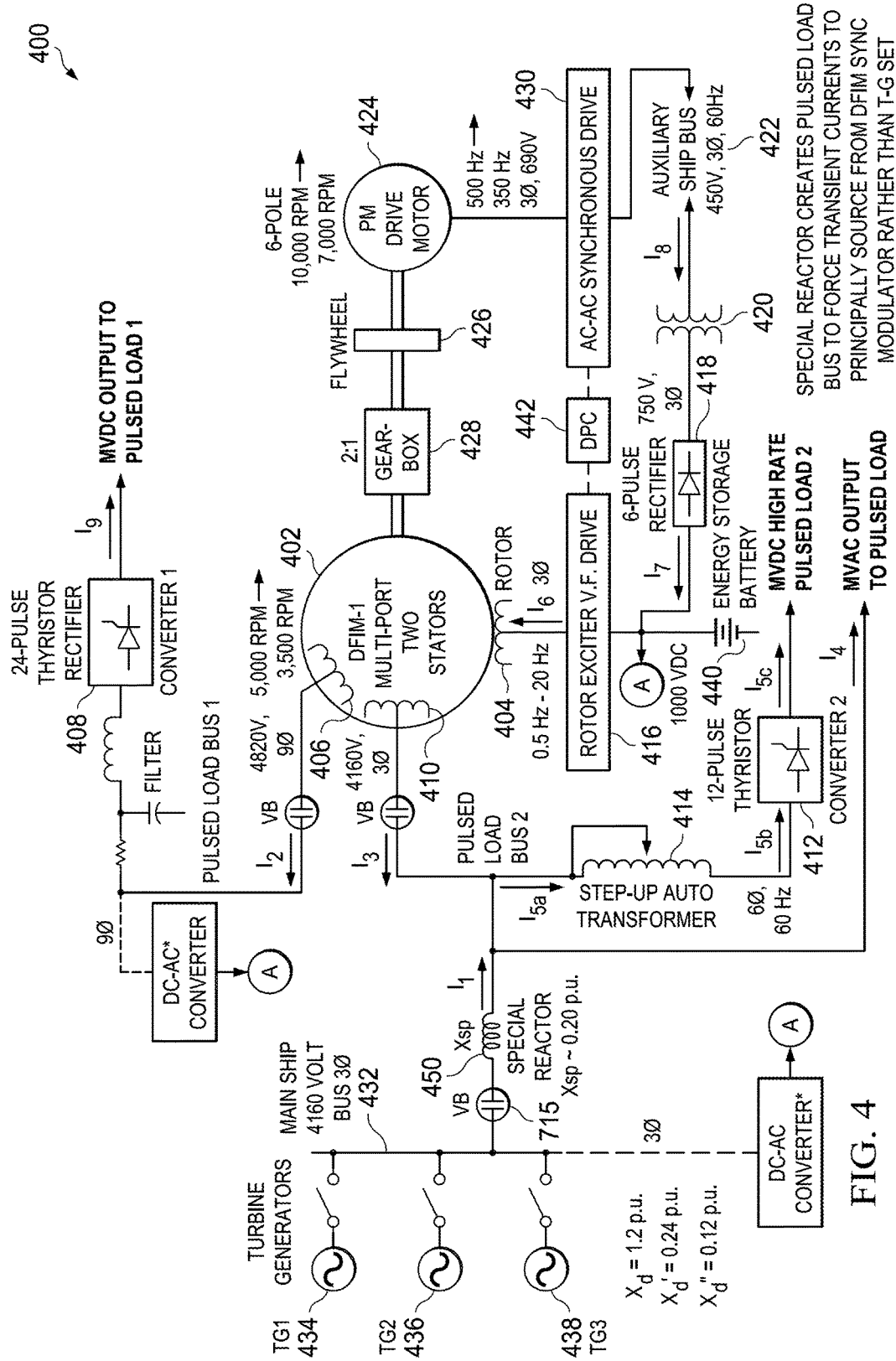
FIG. 4 illustrates a HESM parallel configuration system according to this disclosure.

FIG. 4 illustrates a HESM parallel configuration system 400 according to this disclosure. The embodiment of the HESM parallel configuration system 400 shown in FIG. 4 is for illustration only. Other embodiments could be used without departing from the scope of the present disclosure.

The HESM parallel configuration system 400 includes a DFIM 402 with three electrical ports consisting of a rotor excitation input port 404 and two output ports 406 and 410, which are all galvanically isolated. DFIM 402 can be configured the same as, or similar to, DFIM 100. The first output port and second output port are located on a common stator structure and are wound for the same frequency but different output voltage levels to suit two different pulsed loads. Stator winding 1 406 provides a first voltage, such as 4820 Volts 9-phase, to a converter-1 408 through current path $I_2$ whereby the converter-1 408 is a bidirectional AC/DC dual converter bridge producing a controllable DC output up to a maximum of 6.5 kilovolts (KV) DC for charging of a PFN. In certain embodiments, the converter-1 408 is a 24-pulse thyristor converter that is able to control the high output at either constant current or constant voltage to deliver a minimum charging time and also protect the PFN from over-charging. Stator winding-2 410 provides a second voltage, such as 4160 Volts 3-phase, to a Converter-2 412 through current path $I_4$ whereby the converter is a uni-directional AC/DC single stage converter bridge producing a controllable DC output up to a maximum of 6.0 kVDC for charging of a pulse forming network (PFN) for a directed energy load or direct feed to a high energy laser. In the example shown in FIG. 3, the converter-2 412 is a 12-pulse thyristor converter that is able to control the high output at either constant current, constant voltage, or constant power mode to deliver a minimum charging time and also protect the pulsed load from over-voltage. To obtain 6.0 kVDC from a 4160 Volt AC bus, a step-up auto-transformer 414 is used to raise the input to converter-2 412, for example, to 4450 Volts line to line ($V_{L-L}$).

Excitation to the DFIM 402 is through current path $I_6$ to the three phase rotor circuit and is derived from a variable frequency motor drive termed Converter-3 416 that derives its input power from an electro-chemical energy storage device ES2. The ES2 is fed from a 6-pulse rectifier 418, which is powered by a step down transformer 420, of approximately 100 kilovolt-Ampere (kVA) capacity, and hence, auxiliary ship bus AC input 422. The voltage level on ES2 is medium voltage DC, such as 1000 VDC, and this same bus can be further used to power a portion of the DC pulsed Bus No. 1 load to augment the Converter-1 408. Certain embodiments of the present disclosure provide an ability for Converter-3 416 to provide fast excitation to the DFIM 402. Since the DFIM 402 has a laminated steel magnetic rotor, in contrast to a conventional synchronous generator of DC excitation with a solid steel rotor, the DFIM 402 rotor flux develops much faster, which directly transfers to a faster rise-time for the output pulse on either Stator Winding No. 1 406 or Stator Winding No. 2. 410. Certain embodiments of the present disclosure yield high slew rates of output power, such as 20 Megawatts per second (MW/s), which also requires that Converter-1 408 and Converter-2 412 be of a direct phase delay rectifier type and thus faster in response than competitive AC to DC converters.

In the example shown in FIG. 4, the master PM drive (PMD) motor 424 is directly coupled to a high speed composite flywheel 426, such as for 10,000 revolutions per minute (rpm), and also coupled through a 2:1 gearbox 428 to the DFIM 402, with a maximum speed of 5,000 rpm. In certain embodiments, the control system limits the excursion of the flywheel 426 set from 7000 rpm to 10,000 rpm or speed reduction to 70% irrespective of upper speed such that only one-half of the kinetic energy is extracted by the electrical loads. The PM drive motor 424 is powered by an AC to AC inverter drive termed Converter-4 430, which is a bidirectional drive that is able to extract energy from ES1 through the PM drive motor 424 or perform emergency shut-down, if necessary. The PM drive can also be used in a regenerative mode to dampen rotor torsional oscillations during the discharge mode.

The master control system is a Digital Power Controller (DPC) that coordinates the ramp rates and power outputs of Converter-3 416 and Converter-4 430. Converter-1 408 and Converter-2 412 have internal gating controllers and are set up to provide closed loop regulation of each subsystem without affecting the general operations of Converter-3 416 and Converter-4 430 except to send a feed-forward signal command when exceptional high ramp rates are required.

Current path $I_1$ provides a means to circulate low ramp-rate power between a main turbine generator bus 430, such as a ship main turbine generator bus, and the DFIM AC pulsed Bus No. 2. For example, while current paths $I_2$ and $I_4$ can accommodate a 20 MW/s ramp, the path $I_1$ is limited to a moderate value, such as 2 MW/s, by selection of the special three-phase reactor 450 Xsp positioned between main AC generation bus and the pulsed AC bus. The exact value of this reactor 450 is dependent on the relative reactances of the main generators and the DFIM reactance of Stator winding-2 410. In certain embodiments, this reactor 450 is an air-core reactor with a linear current versus inductance characteristic that buffers the turbine generators from heavy pulsing action occurring on either the AC Pulse Bus No. 1 or AC Pulse Bus No. 2.

The scheme illustrated in FIG. 4 is referred to as a parallel scheme since, for low power or low-rate transfer between pulsed AC busses and the main turbine generator bus, the two subsystems are effectively in parallel. Each turbine generator, TG1 434, TG2 436 and TG3 438, has synchronous reactance Xdi. When "N" identical generators are operating in parallel, the effective turbine generator bus acts as a single generator of Xd=XdiN reactance. The main generators as a group exhibit a synchronous reactance Xd and the DFIM exhibits a synchronous reactance Xddf such that, by design:

$$Xddf > Xd \quad (1)$$

However for the transient and sub-transient machine characteristics, the DFIM exhibits a lower value of both transient Xddf' and sub-transient reactance Xddf" than the main generators or reactance Xd' or Xd":

$$Xddf' < Xd' \quad (2)$$

$$Xddf'' < Xd'' \quad (3)$$

Herein is an example of main generator equivalent circuit terminal parameters (in per unit):
Xd=1.05 Synchronous direct axis reactance, unsaturated;
Xq=0.70 Synchronous quadrature axis reactance;
Xd'=0.30 Direct axis transient reactance;
Xd"=0.20 Direct axis sub-transient reactance;
Xq"=0.20 Quad axis sub-transient reactance;
X2=0.20 Negative Sequence reactance;
Xo=0.18 Zero-sequence reactance;
R2=0.035 Negative sequence resistance; and
R1=0.005 Positive sequence resistance.

The doubly-fed machine is so designed to have the following terminal characteristics (in per unit):
Xddf=1.25 Synchronous direct axis reactance, unsaturated;
Xq=0.85 Synchronous quadrature axis reactance;
Xddf=0.16 Direct axis transient reactance;
Xqdf=0.14 Quadrature axis transient reactance;
Xddf'=0.06 Direct axis sub-transient reactance;
Xqdr=0.06 Quadrature axis sub-transient reactance;
X2df=0.06 Negative Sequence reactance;
Xodf=0.05 Zero-sequence reactance;
R2df=0.011 Negative sequence resistance; and
R1df=0.005 Positive sequence resistance.
Steady State Operations.

When there is little pulsing activity on the AC pulsed bus No. 2 and a second load, such as a radar system, is drawing a steady state load such as when in receive mode, the DFIM 402 provides no significant real power to this bus and majority of power is derived from the main turbine generators, that is, TG1 434, TG2 436 and TG3 438. If the terminal voltage at the generators is V1 and the voltage on the AC pulsed Bus No. 2 is V2 with the special reactor Xsp separating these 2 systems, the real power delivered is:

$$P = V1 * V2 * \sin(\delta)/Xsp \quad (4)$$

where δ is the electrical angle across the special reactor 450. In a typical mode, V1=1.00 per unit, V2=1.05 per unit, δ=15 degrees and Xsp=0.35 per unit resulting in a per unit power delivery of 0.776 per unit. As it is permissible in a steady-state mode for the DFIM stator output No. 2 (AC pulsed bus No. 2) to run at a higher voltage than the main generator bus, the action of the DFIM 402 will be to provide leading Volt-Amperes Reactive (VARs) through current $I_3$ to the main ship bus and also power factor compensate the second load, such as the radar load. In this mode, the DFIM 402 is acting as a synchronous condenser with no significant shaft torque or power. In steady state operations, the DFIM rotor AC polyphase exciter is responsible for maintaining the AC Pulsed Bus voltage high at, for example, 1.05 per unit, and providing power factor compensation.

Transient Mode

Figure 5:
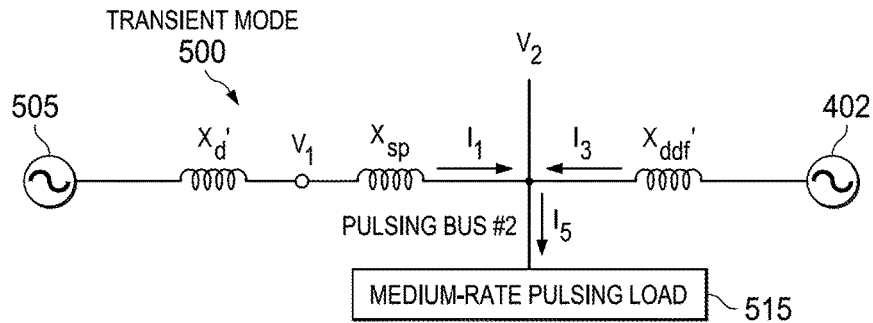
FIG. 5 illustrates an equivalent circuit diagram showing transient mode division of currents and reactances according to this disclosure.

FIG. 5 illustrates an equivalent circuit diagram showing transient mode division of currents and reactances according to this disclosure. In the equivalent circuit diagram 500 for the transient case, load pulsations are prominent and each generator has a change in internal reactance to levels of Xd' for the main turbine generators 505, which include TG1 434, TG2 436 and TG3 438, and to Xddf' for the DFIM 402. In a practical configuration, the main turbine generators 505 are salient pole machines and the DFIM 402 is a round-rotor machine with reactances in d and q axes about equal. However, various embodiments of the present disclosure also cover the cases where both turbine generator 505 and DFIM 402 machines are round rotor machines.

The pulsing load 515 impedance of lagging power factor of Bus No. 2 current $I_5$ is represented as R5+jX5=1.0+j6.0 per unit. With example values listed, that is, Xd'=0.30 p.u., Xsp=0.35 p.u. and Xddf'=0.16 p.u., since current I3 is fed through a reactance 0.16 p.u. and $I_1$ is feeding through a combined internal and Xsp reactance of 0.65 p.u., the dominant current is $I_3$. Thus in this interval, the DFIM 402 will be supplying 4.06 times the transient power of the main turbine generators 505. Accordingly, this embodiment reduces power delivery and fluctuations during transient mode on main turbine generators 505. Transient mode can be defined for pulsations that have a time constant of about 0.30 seconds to 3.0 seconds.

Sub-Transient Mode

Figure 6:
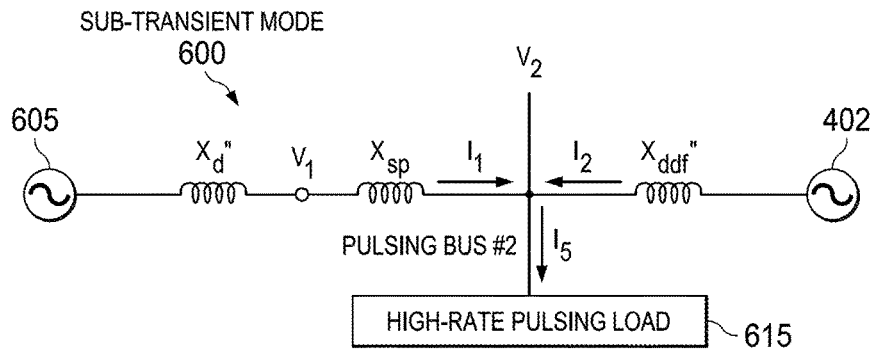
FIG. 6 illustrates another equivalent circuit diagram showing sub-transient mode division of currents and reactances according to this disclosure.

FIG. 6 illustrates another equivalent circuit diagram showing transient mode division of currents and reactances according to this disclosure. In the equivalent circuit diagram 600 for the sub-transient case, load pulsations are very fast and prominent and each generator, TG1 434, TG2 436 and TG3 438, has a change in internal reactance to levels of Xd" for the main turbine generators 605, namely, TG1 434, TG2 436 and TG3 438, and to Xddf" for the DFIM 402.

The pulsing load 615 impedance of lagging power factor of Bus No. 2 current $I_5$ is represented as R5+jX5=1.0+j6.0 per unit. With example values listed, that is, Xd"=0.20 p.u., Xsp=0.35 p.u. and Xddf"=0.06 p.u., since current $I_3$ is fed through a reactance 0.06 p.u. and $I_1$ is feeding through a generator internal reactance and Xsp combined reactance of 0.55 p.u., the dominant current is $I_3$. Thus the DFIM 402 will be supplying 9.1 times the transient power of the main turbine generators 605. This improvement reduces power delivery and rapid fluctuations during sub-transient mode on main turbine generators 605. Sub-transient mode can be defined for pulsations that have a time constant of about 0.01 seconds to 0.30 seconds.

In many applications, such as radar in a transmitting active mode, the sub-transient mode is repeated on a reoccurring basis every few seconds for an extended period of time. By reducing the sub-transient current and power draw at the main turbine generators, this lessens the impact of sudden loading on the turbines, increases stability and lengthens generator lifetime.

In the sub-transient mode, the rotor exciter for the DFIM 402 may have minimal time to react to boost excitation to compensate for sudden load changes if these have a time constant of, for example, 30 ms. Therefore, the DFIM output bus is kept at a per unit voltage level of 1.05 to 1.10 above the main generator bus and during sudden load changes, the AC pulsed bus No. 1 or No. 2 voltage may dip to a value lower than 1.0 per unit. This droop in voltage is compensated for by the fast regulating action of the 12-pulse thyristor, namely converter-2 412, or 24-pulse thyristor, namely converter-1 408, on these busses.

Excitation and PM Drive

Referring to FIG. 4, the rotor excitation system (RES), for example variable frequency motor drive termed Converter-3 416, for the DFIM 402 is fed from a battery stabilized 440 DC bus fed by a 6-pulse rectifier from the auxiliary ship bus 422 rather than being fed from the pulsed bus. The PMD motor 424 AC to AC drive (PMD) (Converter-4 430) for the inertia set is also fed from the auxiliary ship bus 422 rather than from a pulsed bus to yield more stability to overall system operations. Both RES (Converter-3 416) and PMD (Converter-4 430) are controlled by a common digital power controller (DPC) 442 that, in a preferred embodiment, receives feed-forward commands from the major pulsed load centers to anticipate rapid load changes. A typical feed forward command for the HESM parallel configuration system 400 is thru a current anticipator logic module (CALM) that calculates the rate of rise of each load current as a di/dt value (e.g., 300 A/µs) at the current-zero crossing of currents $I_2$, $I_4$, and $I_5$.

The PMD motor 424 contains a set of closed loop controllers that have an inner voltage loop, an inner current loop and an outer speed regulating loop. The drive is commanded to maintain the inertial energy storage set at its peak speed for majority of operations, thereby maximizing kinetic energy of the set at all times. The rate of power demand is established according to the overall inertia of the set and predicted cycle times for pulsed loads. This command is only modulated by a feedback from the main turbine generators when power to other load circuits is high and the PM accelerating power must be moderated from peak values.

The DFIM can be excited by DC current into the rotor to help with system dynamic stability. When the DFIM 402 is solidly connected to the main power system, and small changes in load are present, both the DFIM 402 and the PMD motor 424 must act in consort to restore system stability. Certain embodiments of the present disclosure show that this combination of two power inputs to a common flywheel inertial energy storage unit can provide sufficient synchronizing power to keep the DFIM 402 on-line and also yield a natural mechanical frequency well below the system electrical frequency to enhance stability. Synchronizing power Pr is calculated as kilowatts/degree displacement of the machine's rotor angle. When the DFIM 402 is DC excited and connected to an infinite bus such as 3 turbine generators, namely, TG1 434, TG2 436 and TG3 438, the DFIM 402 as a synchronous machine oscillates with frequency, in cycles per second (cycles/sec):

$$f_n = 587/\text{rpm}*\text{SQRT}(f*Pr/WR^2) \qquad (5)$$

and this subsides unless there is a reoccurring transient. The term $WR^2$ is the inertia of the combined flywheel, DFIM 402 and PMD motor 424:

$$WR^2 = E*(3.23\times10^6)/\text{rpm}^2 \qquad (6)$$

For example, when the total stored energy E is 40 MJ at 5000 rpm, the $WR^2$=6927 lb-ft$^2$.

If an incremental displacement $\Delta\Theta$ is assumed, the corresponding synchronizing power increment is:

$$\Delta P = \Delta\Theta * Pr \text{ in kilowatts (kW)} \tag{7}$$

The acceleration of the complete rotor and flywheel system is:

$$\alpha = 180 * f_n * \Delta P / (kVA * H) \text{ in degrees/sec}^2 \tag{8}$$

or $$\alpha = (10^6/0.231) * f * Pr * \Delta\Theta / (WR^2 * rpm^2) \text{ in rad/sec}^2 \tag{9}$$

$$= -K * \Delta\Theta \tag{10}$$

Pr is negative as an increment in $\Delta\Theta$ produces a torque that tends to return the rotor to a steady state operating angle. Thus, K is positive.

$$K = -\pi 10^6 * f * Pr / (0.231 * WR^2 * rpm^2) \tag{11}$$

$$\alpha = d^2(\Delta\Theta)/dt^2 \tag{12}$$

Let $\Delta\Theta = A \sin(2\pi f_n t)$, therefore $$f_n = \text{SQRT}(K)/2\pi \tag{13}$$

For a full scale large system, if the synchronizing power Pr is for example 100 kW/deg, the natural frequency is 3.46 Hz. Thus in certain embodiments, having $f_n$ less than system electrical frequency at all operating points is a desirable feature.

For systems whereby large transients are reoccurring, or large swings in power output are necessary in short time intervals, the machine set cannot maintain synchronism with the main power grid and consequently the machine will fall in speed and must be slip-frequency controlled through the polyphase AC exciter on the DFIM 404 rotor.

Figure 7:
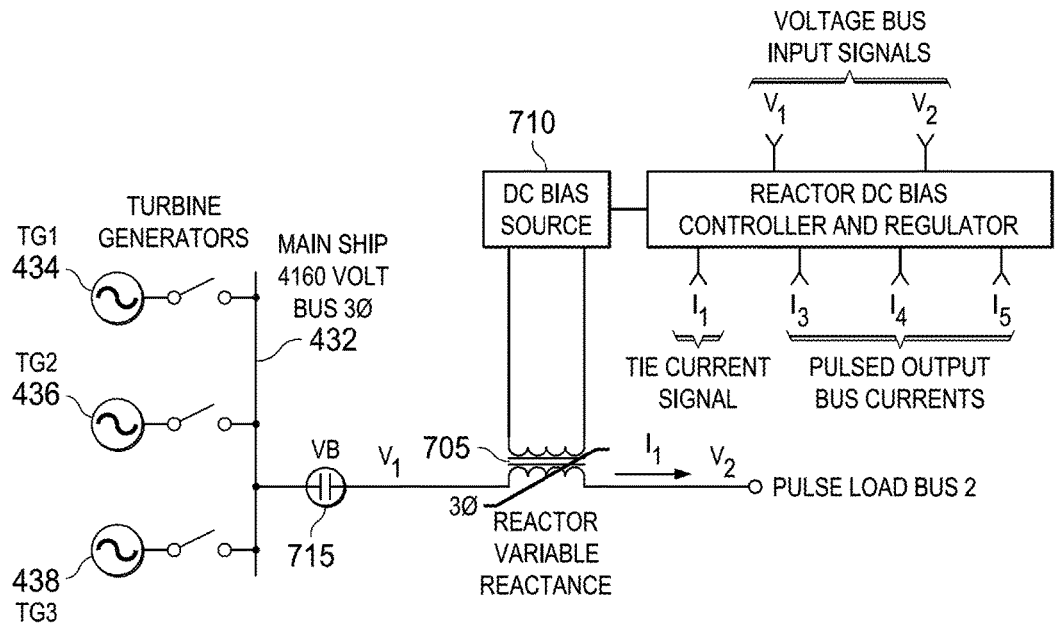
FIG. 7 illustrates a Parallel HESM scheme showing addition of AC saturable reactor on interconnection bus according to this disclosure.

FIG. 7 illustrates a Parallel HESM scheme showing addition of AC saturable reactor on the interconnection bus according to this disclosure. The embodiment of the Parallel HESM scheme shown in FIG. 7 is for illustration only. Other embodiments could be used without departing from the scope of the present disclosure.

FIG. 7 shows the modification of FIG. 4 to use an AC saturable reactor 705 in place of the air-core special reactor 450. The AC saturable reactor 705 is a non-linear reactor and the series reactance of the AC saturable reactor 705 is controlled by the level of DC excitation 710 on the ferromagnetic core by injection of a low power DC bias current. The AC saturable reactor 705 is intended as a polyphase (3 phase) reactor whereby the DC bias current is provided by a single loop, single DC circuit linking all three magnetic cores. The power required for DC bias is often 1% to 2% of the total AC power controlled. A separate current regulator and controller system 720 set the bias on the reactor according to the need for the DFIM 402 to provide power back to the turbine generators or accept power from TG1 434, TG2 436 and TG3 438. The controller system 720 has input signals of 4 currents: $I_1$, $I_4$, $I_5$, and $I_6$ in addition to bust voltages $V_1$ and $V_2$. In a high-slew rate operational mode when the DFIM 402 is called upon to provide the main pulsed power and isolate the DFIM circuits from the turbine generators, such as by opening VBs 715, the saturable reactor 705 is set to yield its maximum reactance, which corresponds to minimum DC bias. When it is desired to have significant power transfer between turbine generator bus 432 and DFIM 402 or AC Pulsed Load Bus 1 or 2, the DC bias is set to a maximum value resulting in lowest AC reactance. Thus this method provides a means of an extra level of power control without need for a full power converter or power semiconductor devices.

Figure 8:
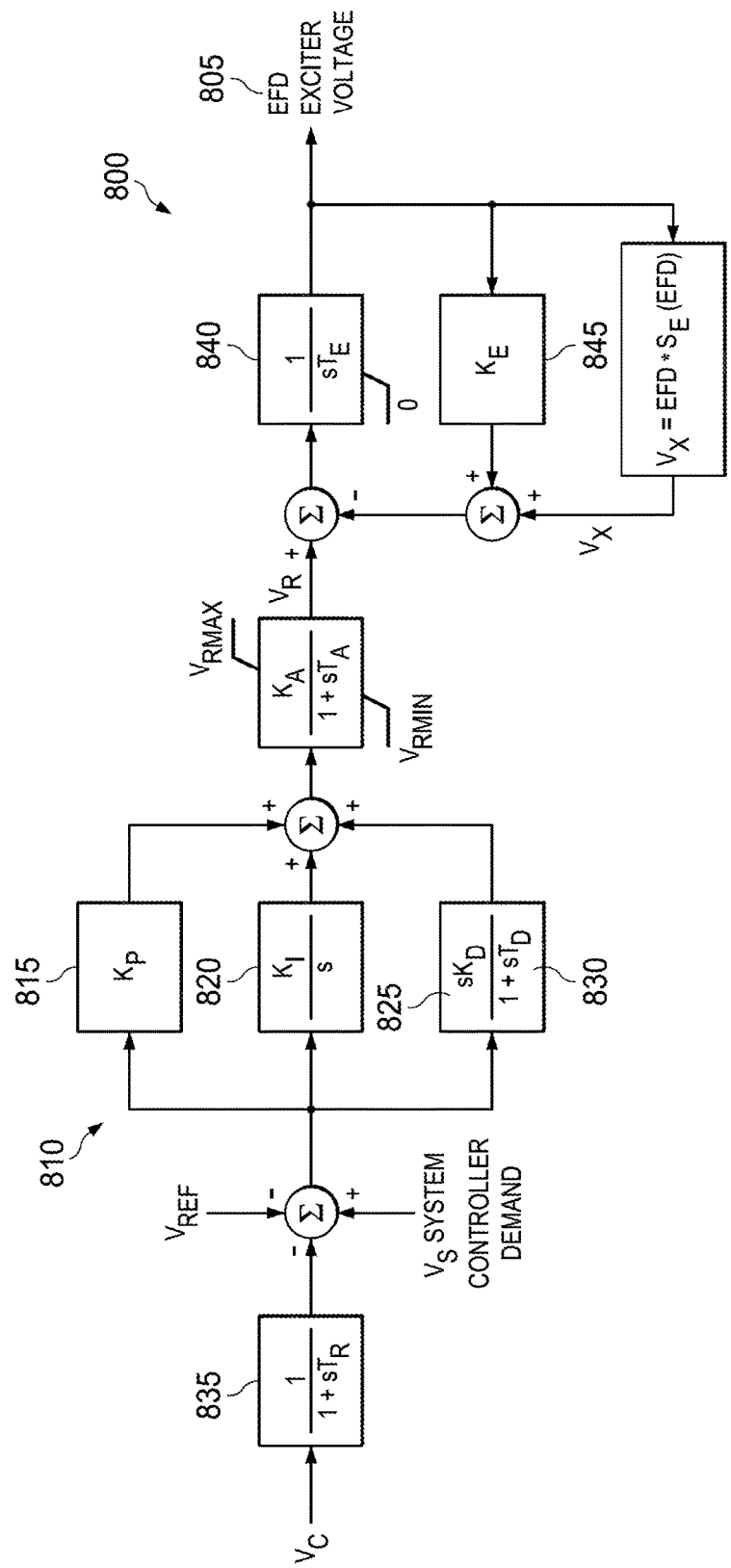
FIG. 8 illustrates an example Control Model (CM) of the main turbine generators at a main power source.

FIG. 8 illustrates an example Control Model (CM) of the main turbine generators at a main power source. The embodiment of the CM 800 shown in FIG. 8 is for illustration only. Other embodiments could be used without departing from the scope of the present disclosure.

In certain embodiments, the CM 800 is a standard regulator model for the main turbine generators with an output of rotor field excitation voltage Efd. The main regulator input after the first reference summation point has three (3) gain constants, Kp 815, Ki 820, Kd 825, and one (1) main time constant, Td 830, defined as:

Kp=proportional gain (typical value 30);
Ki=integral gain (typical value 5);
Kd=derivative gain (typical value 5); and
Td=derivative time constant (typical value 0.08 s)

Other control parameters, Tr 835, Te 840 and Ke 845, and are defined as:

Tr=voltage transducer time constant (typical value 0.01 s);
Te=exciter time constant;
Ke=exciter gain The PM drive motor controller is a conventional drive that provides constant flux to the motor by controlling the Volts/Hz ratio output at a given constant during wide variations in output speed and frequency. The PM drive motor controller includes processing circuitry, such as one or more processors, and a memory that includes instructions stored therein that, when executed, cause the processing circuitry to maintain the shaft sped and kinetic energy at the highest level possible unless a signal is received from the turbine generator bus to limit the drive's acceleration or power draw. The drive motor accepts continuous feedback inputs from current, voltage and speed transducers, as shown in FIG. 9, wherein a Type II servo regulating multi-loop scheme 900 is defined with tight control of speed (usually less than 1% speed error) once the desired peak speed is obtained.

Figure 9:
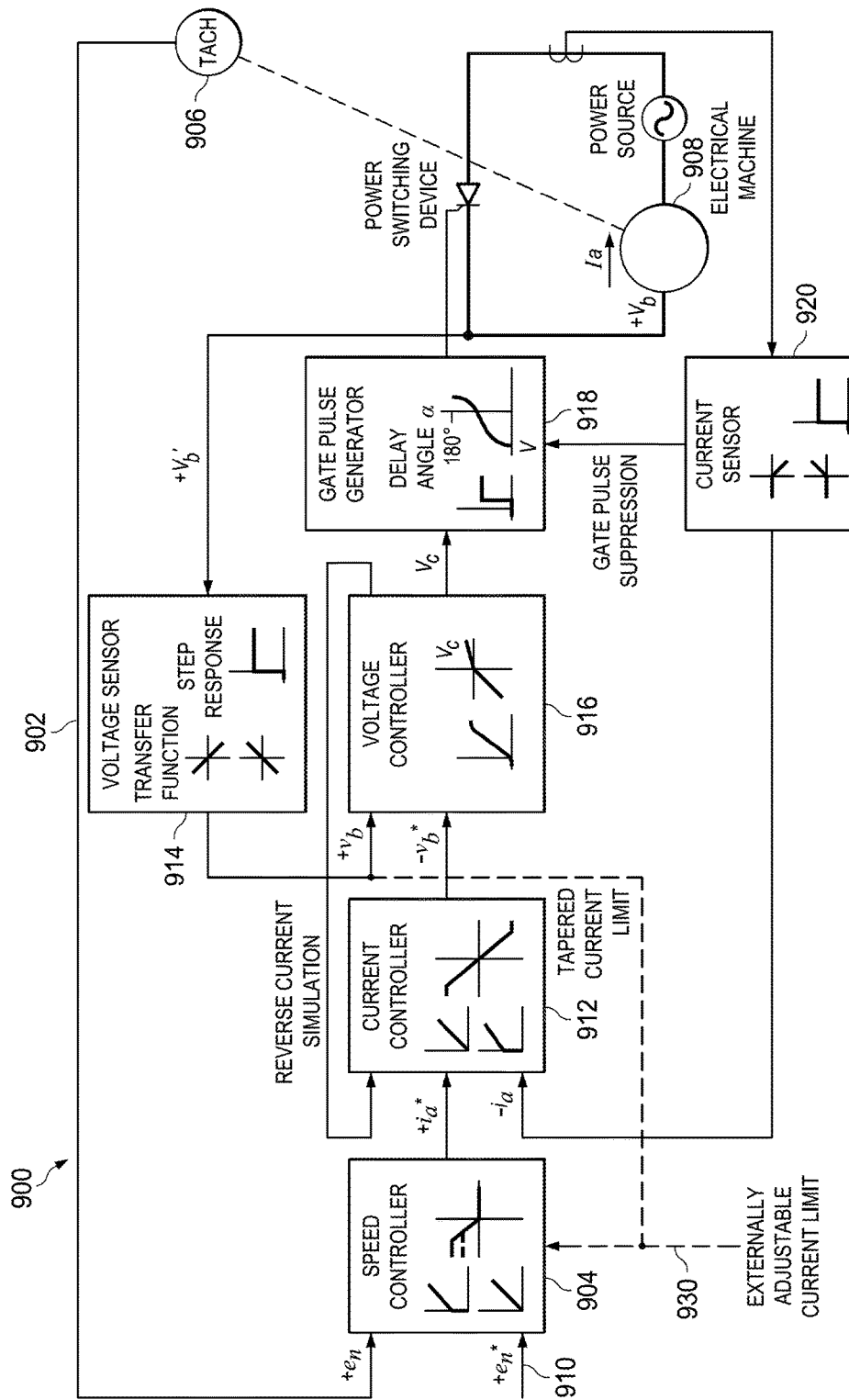
FIG. 9 illustrates a multi-loop control scheme for drive motor connected to inertial storage device according to this disclosure.

FIG. 9 illustrates a multi-loop control scheme for a drive motor connected to inertial storage device according to this disclosure. The embodiment of the multi-loop scheme 900 shown in FIG. 9 is for illustration only. Other embodiments could be used without departing from the scope of the present disclosure.

The main outer loop 902 includes the speed controller 904, which uses a tachometer input +en 906 from the drive motor 908 or flywheel shaft speed and takes a reference signal -en* 910 from the system master controller and produces a current controller demand signal +ia*. The current controller 912, which is also the torque controller, has an input summing junction of three inputs: +ia* reference, the current sensor signal -ia and the reverse current simulation signal. The output of the current controller 912 is a voltage controller input reference signal -Vb*. A voltage sensor 914 generates a voltage feedback signal +Vb from the drive motor 908 or flywheel shaft speed. The input reference signal -Vb* enters a summing junction 916 with +Vb to create a master control signal Vc. The master control signal Vc regulates the gate pulse generator (GPG) 918 for the IGBTs or thyristor power devices. The higher the level of Vc, the higher will be the applied system frequency and voltage, but constrained to a fixed V/Hz ratio. If the load current (or torque) is measured as being over a preset limit, a current sensor 920 feedback will send a gate suppression signal to the GPG 918 to cut off or reduce the gating of power switching devices.

The drive motor controller also provides for an external current limit input 930 from the system master controller to limit input current draw and flywheel acceleration rate by adjusting the input bias on the speed controller 904. The drive motor controller is bidirectional and allows for deceleration of the flywheel and energy recovery back into the auxiliary power system.

Figure 10:
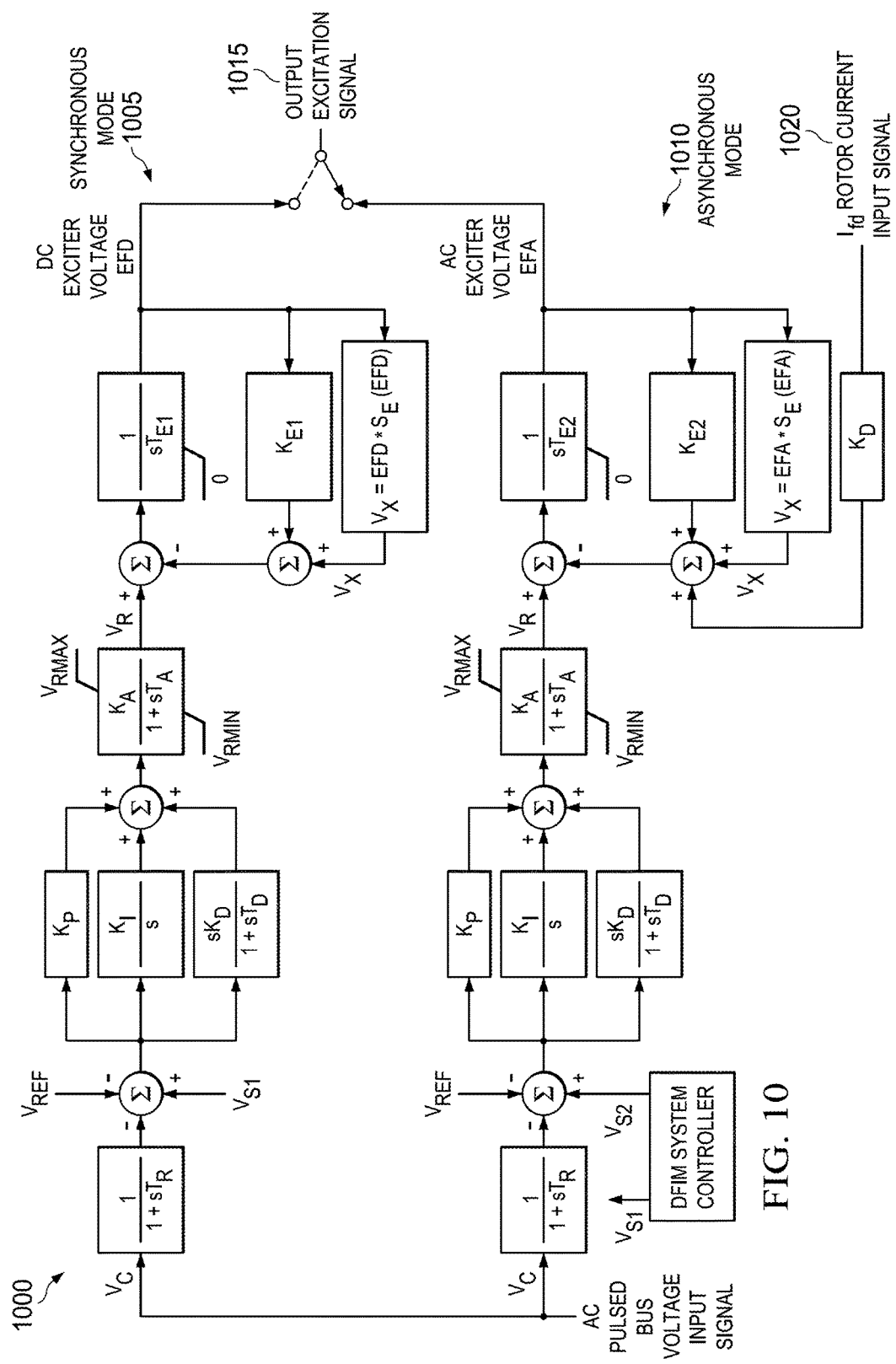
FIG. 10 illustrates an excitation controller for the DFIM according to this disclosure.

FIG. 10 illustrates an excitation controller for the DFIM according to this disclosure. The embodiment of the excitation controller 1000 shown in FIG. 10 is for illustration only. Other embodiments could be used without departing from the scope of the present disclosure.

The excitation controller 1000 for the DFIM has two basic modes of operation: synchronous mode 1005 and asynchronous mode 1010. Synchronous mode 1005 is when the machine is DC excited, the flywheel has attained a steady-state speed in synchronism with main system frequency and power input/output is controlled by small changes in rotor angle. This is shown in upper portion of FIG. 10 where the output is exciter field voltage Efd. Asynchronous mode 1010 is when the machine is polyphase AC excited, the flywheel shaft speed is rapidly changing and the machine is acting as a doubly-fed induction machine but having a stator frequency output equal to the main system bus frequency, having both direct and quadrature axis control. This is represented by the lower portion of FIG. 10 and uses an additional input signal for rotor current $I_{fd}$ 1020. The time constants and gains are different in each mode. A discrete switch 1015 transitions the excitation controller 1000 from synchronous mode 1005 to asynchronous mode 1010 and vice versa.

Figure 11:
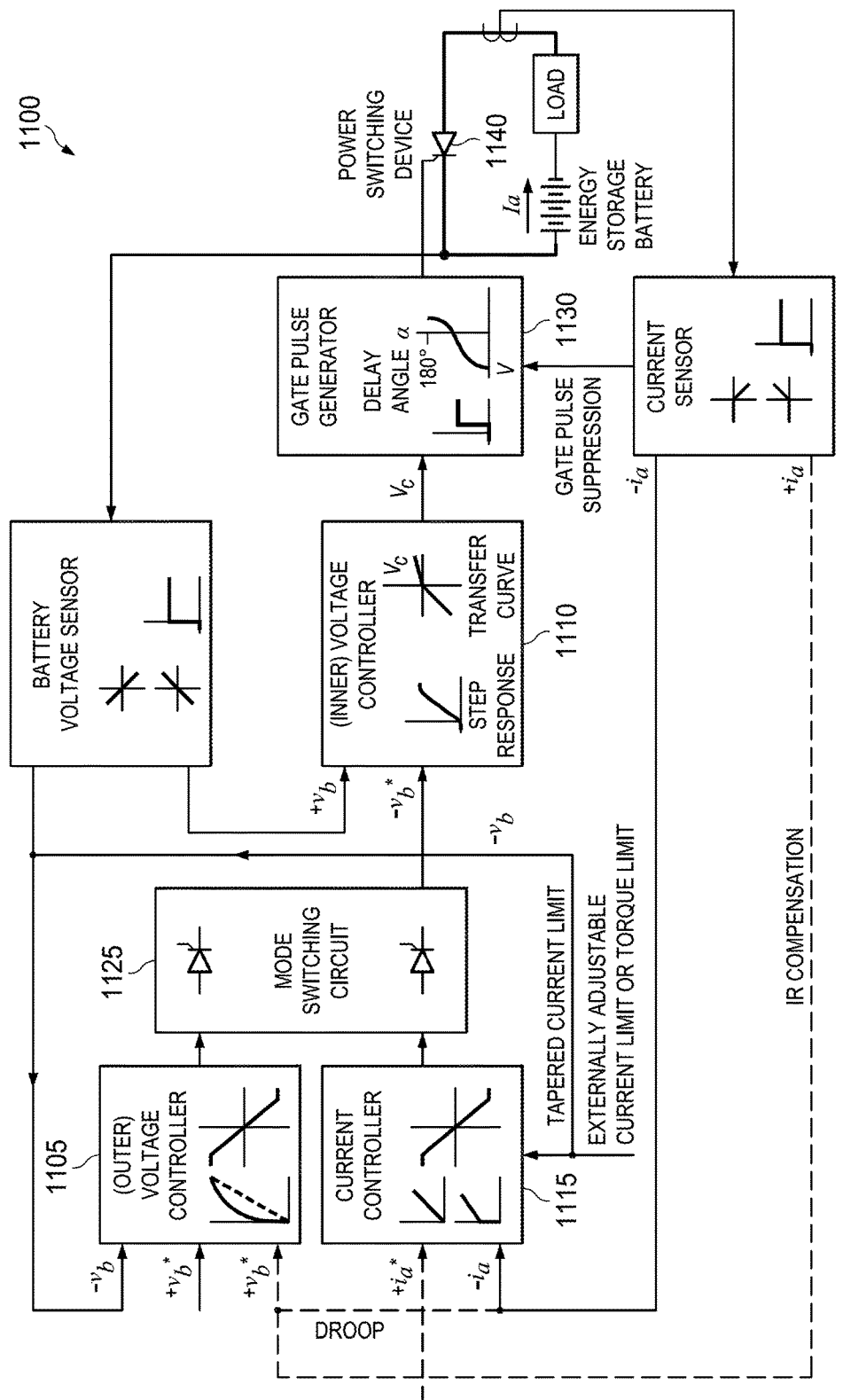
FIG. 11 illustrates a parallel multi-loop control scheme according to this disclosure.

FIG. 11 illustrates a parallel multi-loop control scheme according to this disclosure. The embodiment of the parallel multi-loop control scheme 1100 shown in FIG. 11 is for illustration only. Other embodiments could be used without departing from the scope of the present disclosure.

The parallel multi-loop control scheme 1100 can be used when a particular source/load device such as the electro-chemical energy storage requires both constant current and constant voltage regulation schemes. The voltage controller includes an outer loop voltage controller 1105 and an inner voltage controller 1110 with output command signal $V_c$ in addition to a standard current regulator 1115. The outer loop voltage controller 1105 and current regulator loop 1115 alternate in priority or command schedule; normally the current regulator loop 1115 is in use first when battery is at low state of charge and as charging progresses the control is transferred over to the outer loop voltage controller 1105 by use of the switching circuit 1125. The outer loop voltage controller 1105 maintains a tapered current limit after a period of constant current. The control includes a gate pulse generator 1130 that receives an input voltage command $V_c$ and outputs a pattern of gating signals to a power electronic switch assembly 1140 connecting the battery to load. These features help to maintain battery health and efficiency.

The control system allows a bidirectional energy flow into or out of the battery, whereby different limits are set for current draw in each direction. Certain embodiments of the present disclosure limit the level of recharge energy put back into the battery for regenerative pulsed loads due to specific electro-chemical heating limits with the cells. In a large PFN load, the stored capacitive energy can only be kept on the capacitor bank for a short period of time, such as 10 seconds, without doing harm to the dielectrics; therefore in some operation modes, when the stored energy cannot be dissipated quickly in the load circuit and the battery energy storage device is unreceptive to an increase of any further energy, the DFIM or flywheel absorbs this recovered energy first. If the DFIM/flywheel set cannot absorb further energy, the excess is returned to the main AC bus or dissipated in a resistor bank. The advantage of the DFIM, such as DFIM 402, is that the DFIM can safely and slowly return energy to the electro-chemical store at a recharge rate such as 2 C rather than at a rate that may be required by the PFN fast discharge time constraint requiring a 20-50 C rate, which exceeds a battery's capabilities. In this fashion, overheating of the battery is eliminated.

Certain embodiments provide an important operational advantage of the DFIM in that the DFIM, such as DFIM 402, serves three broad functions:

1) Provides virtually constant torque operation for inertial energy storage over a broad range of shaft speeds by having a current output rating constant over the same range, and in so doing the acceleration and deceleration times are minimized for fast response. Moreover by limiting the applied frequency to the DFIM 402, the upper flywheel 426 speed is maintained within safe boundaries 2) Real power is exchanged between inertial energy storage unit and a pulsed AC bus at a faster rate than a conventional synchronous machine since the DFIM 402 has lower internal time constants than a wound field synchronous machine and once in AC excitation mode, there is no concern over falling out of synchronism with the supply frequency. The availability of very fast acting inverter drives supplying the rotor circuit of the DFIM with ability to ramp frequency at rates such as 100 Hz/ms means the DFIM 402 can respond quickly to power demand surges, which require a change in speed to extract energy from the inertial storage unit.

3) Reactive power is exchanged between DFIM stator windings and a pulsed AC bus at a faster rate than a conventional synchronous machine since the DFIM 402 has lower internal time constants than a wound field synchronous machine. When the applied or extracted real power of a pulsed load is small as in steady state operations, the DFIM acts similar to a synchronous condenser in supplying leading VARS to the overall power system (including main AC turbine generator bus) and correcting for poor power factor of the loads. In general, the reactive power output is electrically decoupled from the real power output and controlled by the adjustable rotor current excitation vector of the variable frequency drive inverter. The apparatus so described here allows independent regulation and control of direct and quadrature axis rotor currents by the exciter, which in turn permits largely independent control of terminal real and reactive power flow from either stator windings.

Figure 12:
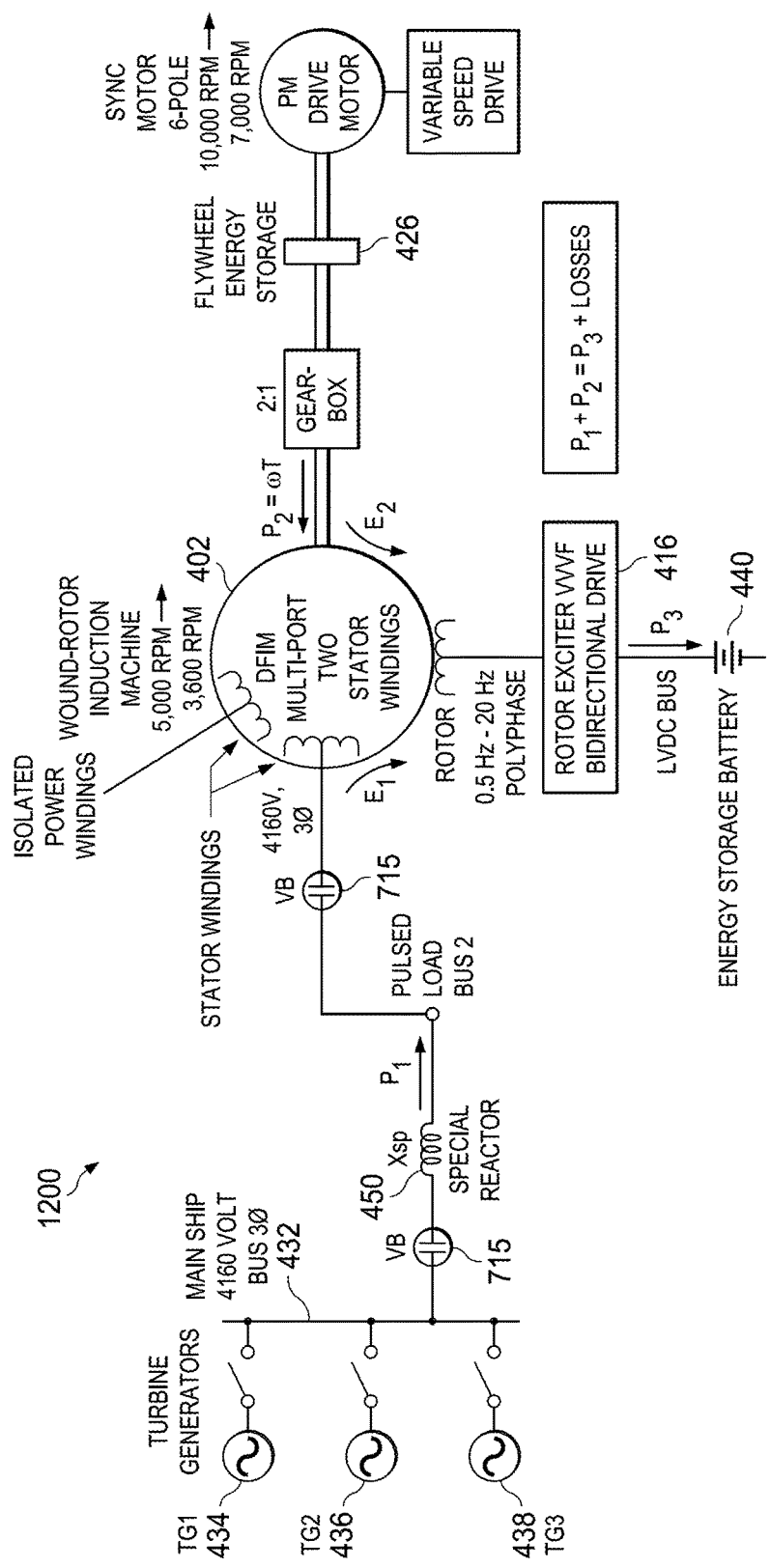
FIG. 12 illustrates a special battery charging mode with combined sources for mega-joule (MJ) charging from the main turbine generator set according to this disclosure.

FIG. 12 illustrates a special battery charging mode with combined sources for mega-joule (MJ) charging from the main turbine generator (T-G) set according to this disclosure. The embodiment of the special battery charging mode 1200 shown in FIG. 12 is for illustration only. Other embodiments could be used without departing from the scope of the present disclosure.

In certain embodiments, the batteries, such as battery 440, is charged, or recharged after discharge, from combined sources, such as inertial storage and generator. The DFIM 402 provides galvanic isolation of pulsed loads from T-G set main power system, which includes TG1 434, TG2 436 and TG3 438. The DFIM 402 also can be configured as counter-rotating dual DFIM & flywheel system for multi-MW peak power. In the example shown in FIG. 12, the battery 440 can be a 500 MJ battery drawing power via the below described charging profile; however other battery sizes and charging profiles could be used without departing from the scope of this disclosure.

For an example charging profile: Charging Power—200 kW limit—sequential use $E_2$=25 MJ from inertial store, P2≤200 kW over 125 sec.*
$E_1$=475 MJ from main turbine generators over 40 min.
500 MJ total recharge over 42 min.

*125 sec. instantaneous response from inertial storage allows time for turbines to prepare for long-term charging and load shedding.

Certain embodiments of the present disclosure include the following features necessary for pulsed power use:

1) The stator of the DFIM 402 is a multi-port output whereby each port is galvanically isolated from another port; if there should a fault in a pulsed load or PFN, the DC component will not propagate to the main AC input or to the other pulsed loads.
2) Each output port can be at a distinct and at a different voltage and reactance level from the next port. This feature minimizes the need for step-up or step-down transformers within a system; thereby reducing size and weight. Since one pulsed load has a particular input AC impedance and the next load has different input AC impedance, it is advantageous to have the DFIM source port for each tailored to a specific impedance level to control voltage regulation and also limit short-circuit current to acceptable levels that will not damage equipment.
3) The DFIM 402 acts as harmonic filter for both super-synchronous and sub-synchronous power oscillations existing on the pulsed AC load busses; this feature reduces the level of electrical harmonics appearing on the turbine generator bus and consequently reduces electrical heating in the turbine generator rotor.

Figure 13:
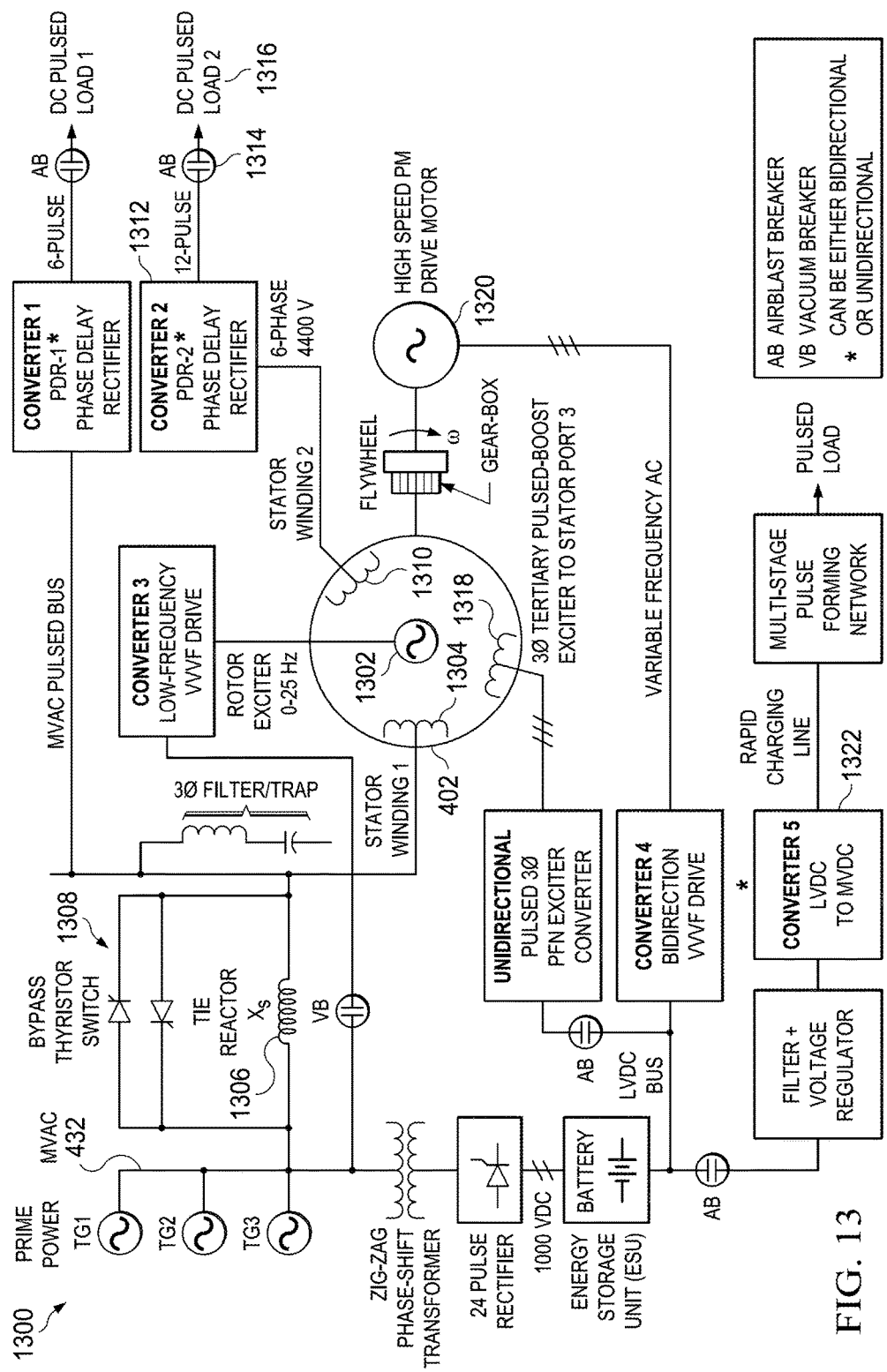
FIG. 13 illustrates a single DFIM in parallel configuration to main power system showing addition of thyristor switch across tie reactor according to this disclosure.

FIG. 13 illustrates a single DFIM in parallel configuration to main power system showing addition of thyristor switch 1308 across tie reactor according to this disclosure. The embodiment of the single DFIM in parallel configuration to main power system 1300 shown in FIG. 13 is for illustration only. Other embodiments could be used without departing from the scope of the present disclosure.

In the example shown in FIG. 13, the DFIM 402 includes three (3) stator ports and one (1) rotor port 1302 wherein stator port No. 1 1304 directly feeds the main turbine generator bus 432 through a tie reactor 1306 that has the added provision of a bidirectional thyristor shunt switch 1308 for bypass operations when it is required to connect the DFIM 402 onto the main grid without any intervening reactance. Winding 1304 also connects to MVAC pulsed load bust feeding converter No. 1. Stator port No. 2 1310 is a 6-phase output that feeds a 12-pulse phase delay rectifier (PDR-2) 1312 followed by an airblast breaker (AB) 1314 and a medium voltage DC pulsed load 1316. Stator port No. 3 1318 is a tertiary winding used strictly for fast or rapid excitation of the machine as previously described in U.S. patent application Ser. No. 14/591,695 entitled "METHOD AND APPARATUS FOR CONTROL OF PULSED POWER IN HYBRID ENERGY STORAGE MODULE" filed Jan. 7, 2015, the contents of which are hereby incorporated by reference in their entirety, and which can augment or boost the normal excitation provided by the rotor excitation circuit from the polyphase low frequency variable frequency supply.

Figure 14:
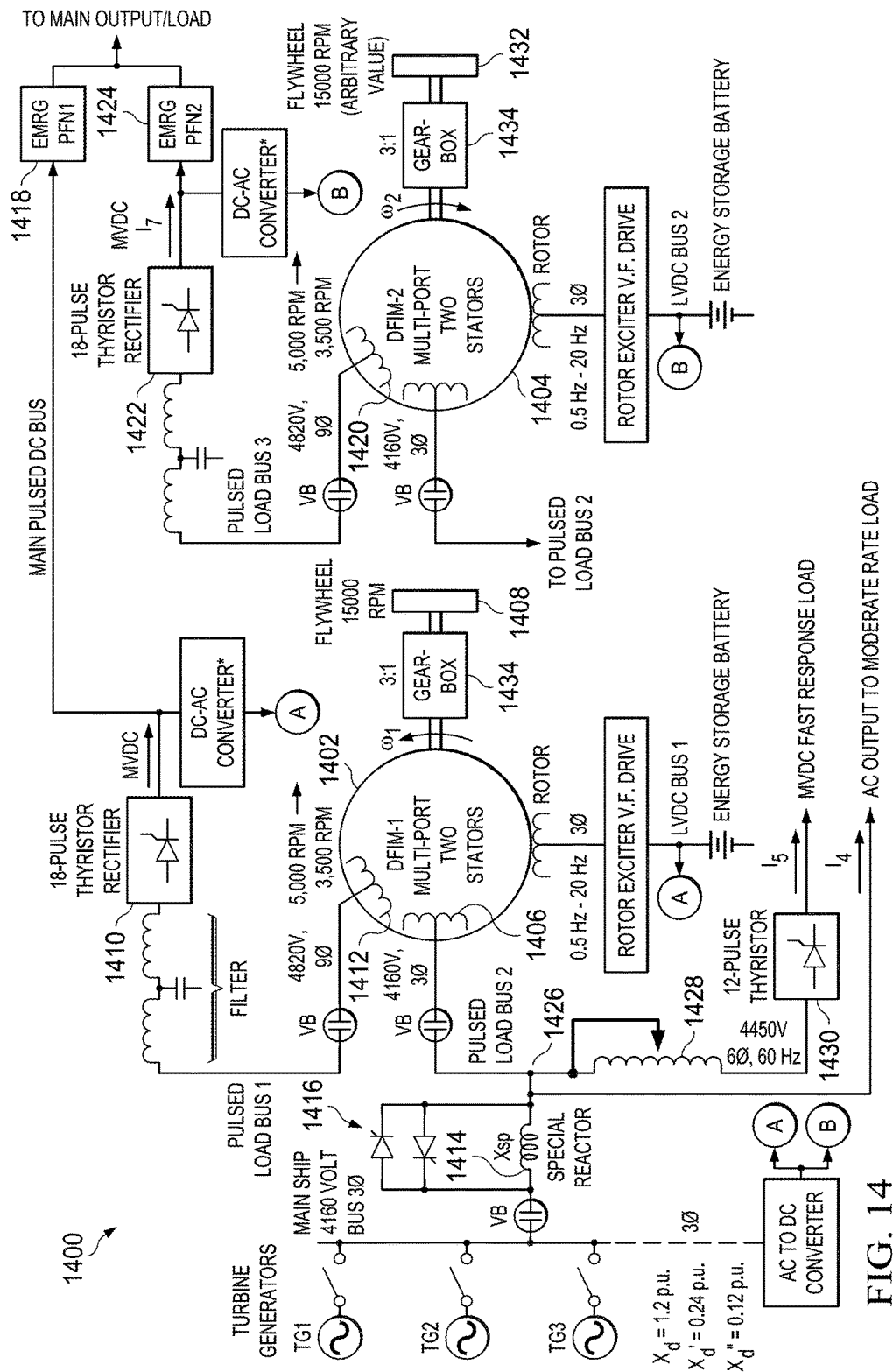
FIG. 14 illustrates a dual DFIM and counter-rotating flywheel system according to this disclosure.

FIG. 14 illustrates a dual DFIM and counter-rotating flywheel system showing addition of thyristor switch across tie reactor according to this disclosure. The embodiment of the dual DFIM and counter-rotating flywheel system 1400 shown in FIG. 14 is for illustration only. Other embodiments could be used without departing from the scope of the present disclosure.

The example shown in FIG. 14 illustrates a dual DFIM and counter-rotating flywheel system with, for example, a 3:1 gearbox or speed reducer between flywheel and electric machinery. The dual DFIM and counter-rotating flywheel system 1400 includes a thyristor bypass switch 1416 across tie reactor 1414 and elimination of separate drive motors to each DFIM-flywheel pair. The dual DFIM and counter-rotating flywheel system 1400 includes a DFIM-1 1402 coupled to a first flywheel 1408 and DFIM-2 1404 coupled to a second flywheel 1432. DFIM-1 1402 and DFIM-2 1404 each can be configured the same as, or similar to, DFIM 100. In the example shown in FIG. 14, the first flywheel and the second flywheel 1432 are each 250 MJ, 15000 rpm flywheels coupled to the respective DFIM through a 3:1 gearbox 1434.

In this configuration, there is no PM drive motor 1320 (coupled to the flywheel) as seen in FIG. 13; instead, the DFIM stator No. 1 1402 is normally used as a motoring winding for increasing flywheel 1408 stored energy in addition to being a generating winding. When the 18-pulse thyristor rectifier 1410 is bidirectional, excess PFN energy, such as from an aborted load operation, can be used to increase flywheel 1408 stored energy through a path going to DFIM stator winding No. 2 1412. The special tie-reactor 1414, which can be the same or similar to tie reactor 1306 illustrated in FIG. 13, has a bidirectional thyristor switch 1416 in parallel for connecting turbine generator sets to the HESM stator winding No. 1 1402 during primarily steady-state operations. Both DFIMs stator windings No. 2, that is, DFIM stator winding No. 2 1412 and DFIM stator winding No. 2 1418, feed independent 18-pulse AC to DC phase delay rectifiers, which feed individual pulse forming networks (PFNs) that are combined in parallel only at their output. For example, DFIM stator winding No. 2 1412 feeds the 18-pulse thyristor rectifier 1410, which feeds PFN-1 1418 and DFIM stator winding No. 2 1420 feeds the 18-pulse thyristor rectifier 1422, which feeds PFN-2 1424. The outputs of PFN-1 1418 and PFN-2 1424 are combined in parallel. The HESM is designed so that stators No. 1 and No. 2, of each DFIM 1402 and 1404, can be operated simultaneously so long as total rated power output of the electrical machinery is not exceeded. The loads are taken from the pulsed load bus No. 2 1426 to isolate these pulsating loads from the main turbine generator set. To obtain a higher DC or AC voltage than the normal voltage which the DFIM stator No. 1 produces, the dual DFIM and counter-rotating flywheel system 1400 includes a light-weight auto-transformer 1428 for step-up of machine level voltage to a level appropriate for special or pulsating loads. The auto-transformer 1428 also offers a degree of filtering of the higher harmonics generated by 12-pulse AC to DC rectifier 1430 or by the load itself. In certain embodiments, the auto-transformer 1428, in addition to voltage transformation, is a 3 phase to 9 phase unit or 3 phase to 6 phase unit allowing the dual DFIM and counter-rotating flywheel system 1400 to use an 18 pulse or 12 pulse rectifier, respectively, which minimizes line harmonics at the T-G set.

Figure 15:
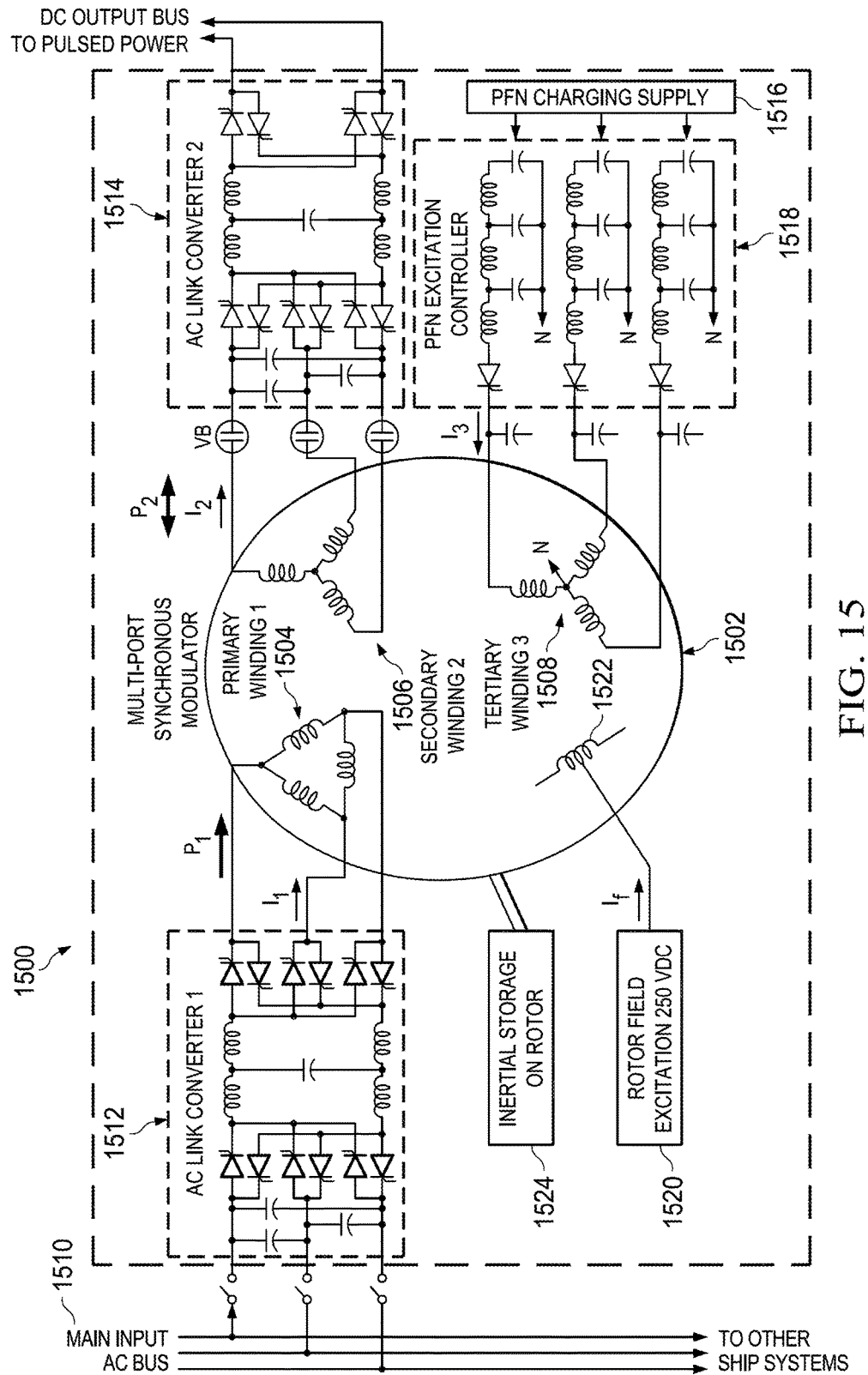
FIG. 15 illustrates a pulsed excitation scheme for stator tertiary winding according to this disclosure.

FIG. 15 illustrates a pulsed excitation scheme for stator tertiary winding according to this disclosure. The embodiment of the pulsed excitation scheme 1500 shown in FIG. 15 is for illustration only. Other embodiments could be used without departing from the scope of the present disclosure.

In the example shown in FIG. 15, a DFIM 1502, which can be the same as or similar to the DFIM 100, is a 9-phase or 12-phase and includes a primary winding (Wdg1) 1504, a secondary winding (Wdg2) 1506 and a tertiary excitation winding 1508. The DFIM 1502 includes multiple stator output and input windings with multiple voltage classes and multiple time constants. The primary windings Wdg1 1504 are fed from an AC source 1510, such as a power bus, for example a medium voltage AC bus, through an AC link converter 1512. The secondary winding Wdg2 1506 feeds a high voltage or medium voltage DC pulse load, for example a with a 10 ms time constant, through AC link to DC converter 1514. The tertiary excitation AC winding 1508 is coupled to a PFN charging supply 1516 through a PFN excitation controller 1518, which in certain embodiments, would have a time constant less than 1.0 ms. The DFIM 1502 has conventional rotor field DC excitation 1520 provided by rotor winding 1522 for powering steady state loads, with a ≤100 ms time constant.

The circuitry of the pulsed 3-phase PFN excitation controller 1518, which feeds stator port No. 3, namely the tertiary winding 1508, is depicted in FIG. 15 wherein the supply is fed from a low or medium voltage DC source, that is, the PFN charging supply 1516, which can be an electrochemical energy storage unit. The PFN excitation controller 1518 has three separate pulse forming networks that are operated 120 degrees apart to form a traveling magnetomotive force (MMF) wave inside the electrical machine, with rise times 4-10 times faster than the normal rotor field excitation from the rotor field DC excitation 1520. The firing switch inside 1518 can be a thyristor, IGBT or triggered spark gap. The period of oscillations of the excitation current $I_3$ may be limited to a specified number of cycles, such as 10 cycles; however, the pulsing pattern can be repeated on a recurring basis contingent upon the power/energy rating of the PFN charging supply 1516. In certain embodiments, AC link converter 1512 for stator Wdg1 1504 and AC link converters 1514 for stator Wdg2 1506 for AC input and DC output respectively maintain control of the synchronous modulator.

Figure 16:
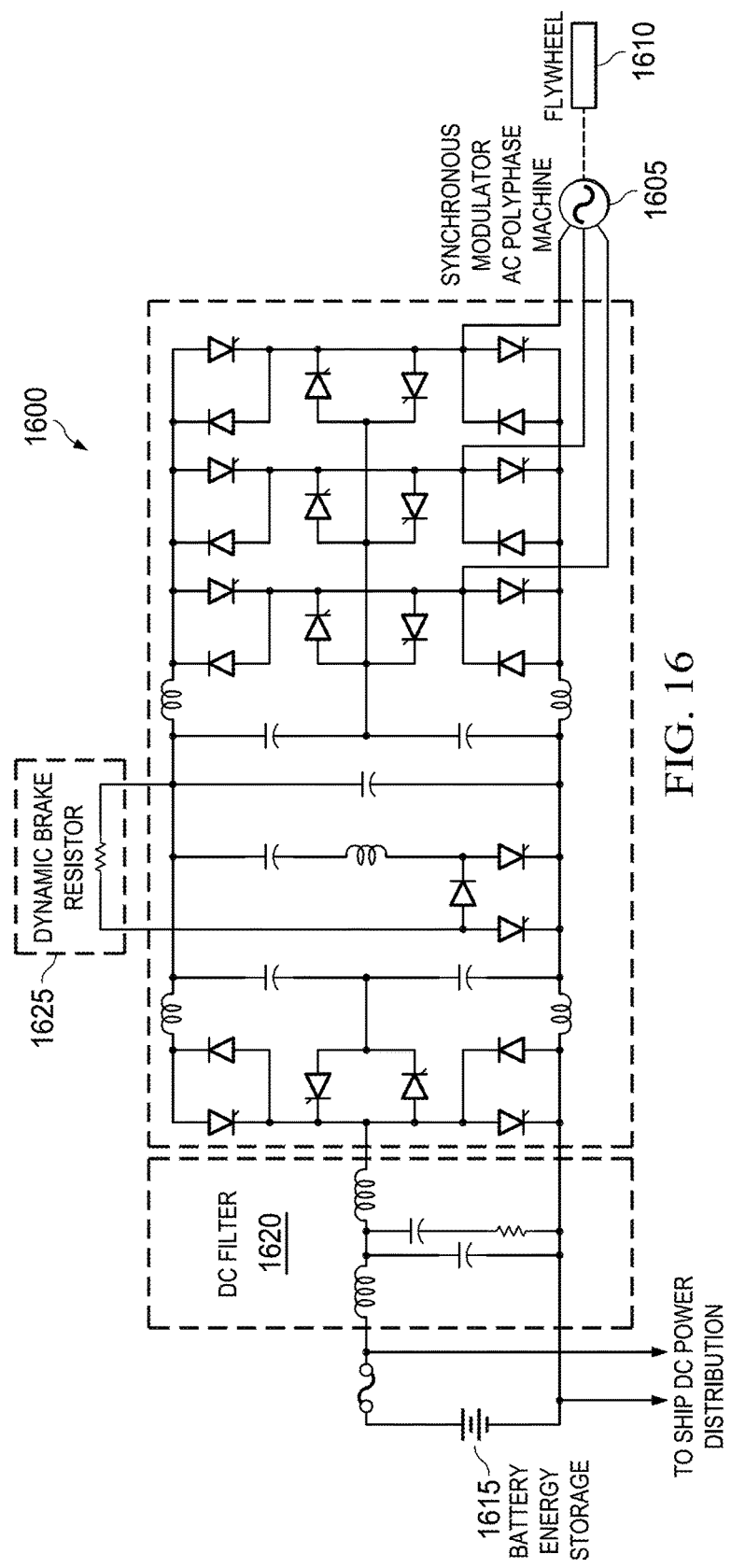
FIG. 16 illustrates a bi-directional variable frequency thyristor inverter drive for high speed synchronous machine controlling level of flywheel energy storage according to this disclosure.

In certain embodiments, use of tertiary winding 1508 with the PFN excitation controller 1518 (Capacitive Discharge) into synchronous modulator/generator allows for fast excitation of electrical machine magnetic circuit resulting in very fast output response with less than 1 ms delay. The pulsed excitation scheme 1500 converts medium voltage AC power into medium or high voltage for pulsed loads, such as operation of electromagnetic effectors, with large scale energy storage FIG. 16 illustrates a bi-directional variable frequency thyristor inverter drive for high speed synchronous machine according to this disclosure. The embodiment of the bi-directional variable frequency thyristor inverter drive 1600 shown in FIG. 16 is for illustration only. Other embodiments could be used without departing from the scope of the present disclosure.

In the example shown in FIG. 16, the bi-directional variable frequency thyristor inverter drive 1600 is a 3-level variable-frequency variable-voltage inverter drive that uses thyristor devices and that is the supply for the high speed synchronous motor 1605, of either permanent magnet or wound field type. The variable frequency thyristor inverter drive 1600 is bidirectional so that kinetic energy can be imparted or extracted from an inertial storage unit, such as a flywheel energy storage unit 1610, with equal rates and equal duty cycle. The bi-directional variable frequency thyristor inverter drive 1600 couples to battery 1615 through a dc filter 1620. The bi-directional variable frequency thyristor inverter drive 1600 also incorporates a dynamic braking resistor circuit 1625 to aid in rapid shut-down of the flywheel energy storage unit 1610 in the event the battery 1615 supply is non-receptive to recovered energy input.

Figure 17:
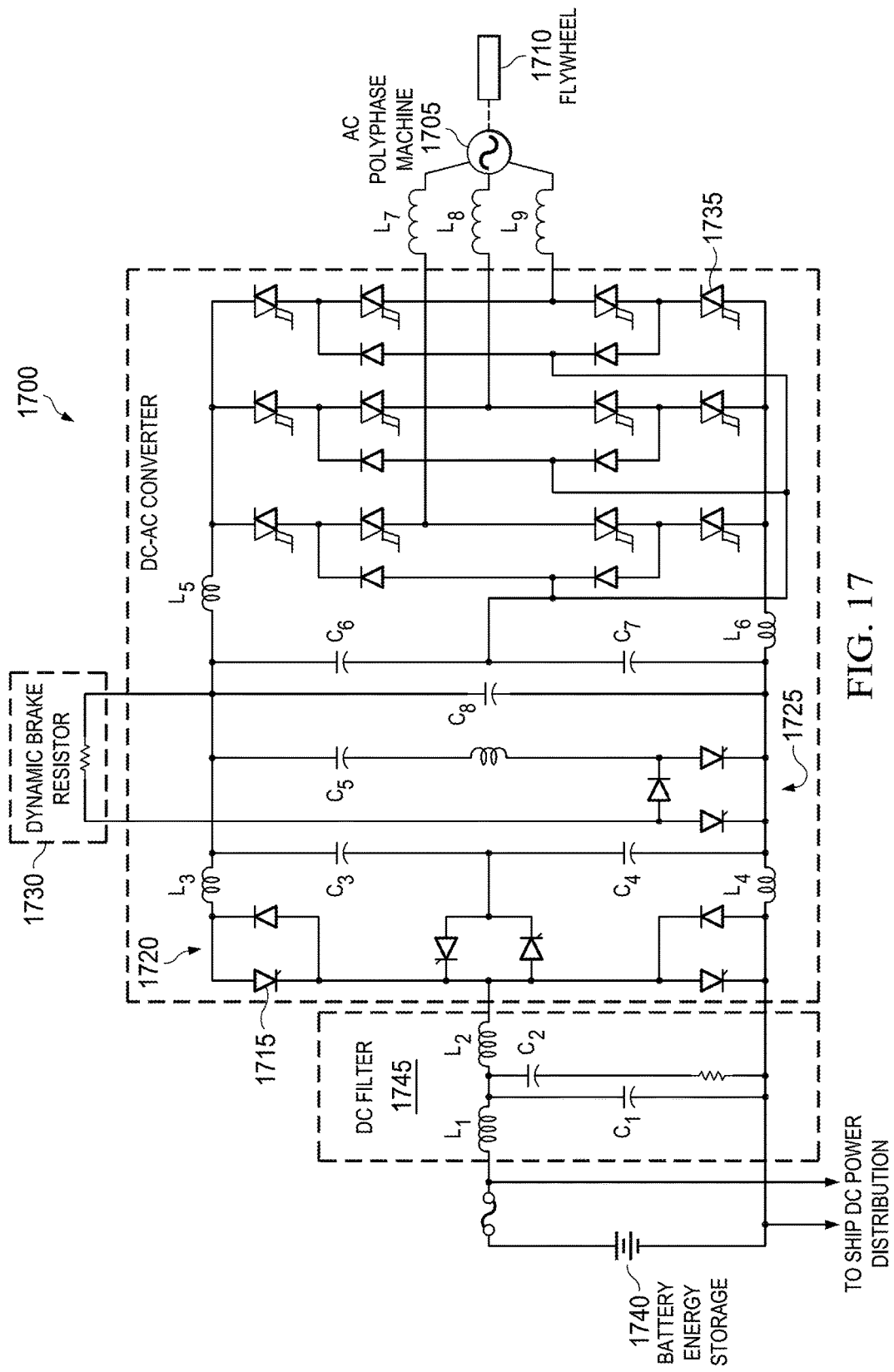
FIG. 17 illustrates a bi-directional 3-level variable frequency inverter drive for high speed synchronous machine with thyristor front-end, insulated-gate bipolar transistor (IGBT) back end and dynamic braking control of DFIM according to this disclosure.

FIG. 17 illustrates a bi-directional 3-level variable frequency inverter drive for high speed synchronous or asynchronous machine with thyristor front-end, IGBT back end and dynamic braking control of DFIM according to this disclosure. The embodiment of the bi-directional 3-level variable frequency inverter drive 1700 shown in FIG. 17 is for illustration only. Other embodiments could be used without departing from the scope of the present disclosure.

In the example shown in FIG. 17, the bi-directional 3-level variable frequency inverter drive 1700 uses IGBT output devices and is the supply for the high speed synchronous or asynchronous motor 1705, of either permanent magnet or wound field type. Alternatively, this drive can supply the rotor circuitry of the DFIM with variable frequency AC excitation power for slip frequency regulation as the inertial storage unit changes speed in a charge mode or a discharge mode. The bi-directional 3-level variable frequency inverter drive 1700 outputs a 3-level AC output, which is preferable for reducing harmonics and losses in the electrical machine. The 3-level variable frequency inverter drive 1700 drive is bidirectional so that kinetic energy can be imparted or extracted from inertial storage unit, such as a flywheel energy storage unit 1710, with equal rates and equal duty cycle. The bi-directional 3-level variable frequency inverter drive 1700 drive also incorporates four (4) thyristor devices 1715 in the front-end of the converter for voltage regulation of the internal DC link bus 1720. The bi-directional 3-level variable frequency inverter drive 1700 also incorporates, in the middle section 1725, two thyristors, one power diode and an L-C series combination, of the converter a dynamic braking resistor circuit 1730 to aid in rapid shut-down of the flywheel energy storage unit in the event the battery storage device is non-receptive to recovered energy input. The dynamic braking resistor circuit 1730 is a chopper circuit whereby the mark-space ratio of the resistor current determines the extent of dynamic braking. The IGBT output devices 1735 are higher frequency devices than the input thyristors 1715 and, as such, can produce an output frequency of up to, for example, 1.5 kHz for operating a 4-pole high speed synchronous motor 1705 and flywheel 1710 at 45,000 rpm. Inductors L3 and L4 are preferably mutually coupled air-core inductors and also inductors L5 and L6 are also mutually coupled air-core inductors. The bi-directional 3-level variable frequency inverter drive 1700 couples to battery 1740 through a dc filter 1745.

Figure 18:
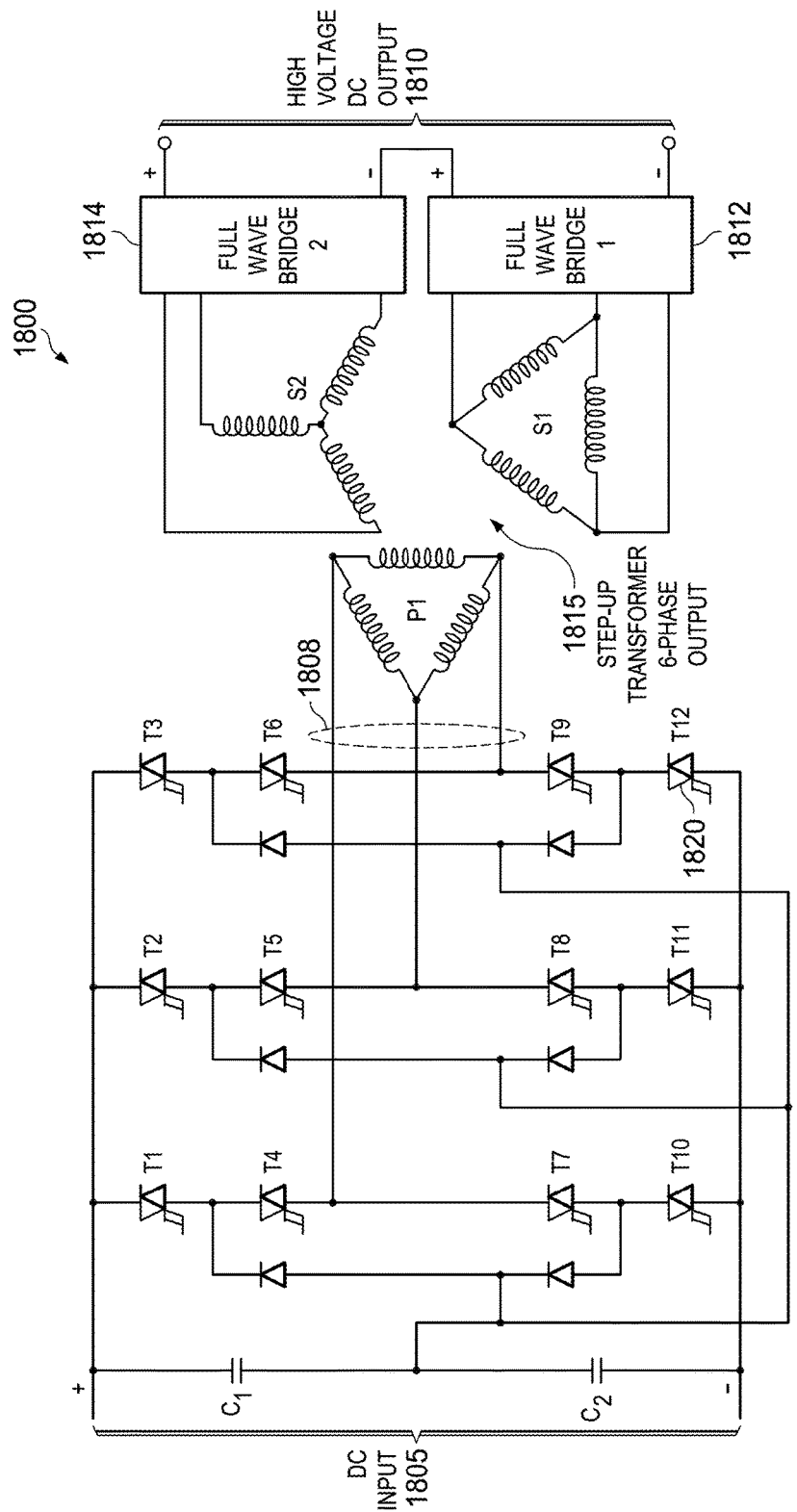
FIG. 18 illustrates a low voltage direct current (LVDC) to medium or high voltage direct current (MVDC/HVDC) converter-transformer-rectifier circuit for controlled rapid charging of high power pulse forming networks from electrochemical storage units feeding the LVDC bus according to this disclosure.

FIG. 18 illustrates a low voltage direct current (LVDC) to medium or high voltage direct current (MVDC/HVDC) converter-transformer-rectifier circuit for controlled rapid charging of high power pulse forming networks from electrochemical storage units feeding the LVDC bus according to this disclosure. The embodiment of the LVDC to MVDC/HVDC converter-transformer-rectifier circuit 1800 shown in FIG. 18 is for illustration only. Other embodiments could be used without departing from the scope of the present disclosure.

FIG. 18 shows an example of a LVDC to MVDC/HVDC converter labeled converter No. 5 1322 in FIG. 13. The DC input 1805 is the electro-chemical storage unit, namely battery 1740, with an associated DC filter 1745 and voltage regulator as shown in FIG. 17 at front end. The output 1808 of the IGBT converter is a delta connected primary to a high voltage step-up transformer 1815 producing both delta and wye connected 3-phase secondary outputs and thus forming a 6-phase system. Each wye and delta output has an independent full wave bridge rectifier 1812, 1814 and the two units are series connected to produce a high voltage DC output 1810 with low harmonic content. At high power levels, current state of the art IGBT devices 1820 are capable of switching at 2.5 kHz and operating the described transformer at a similar medium frequency to minimize weight and size of the magnetics.

Figure 19A:
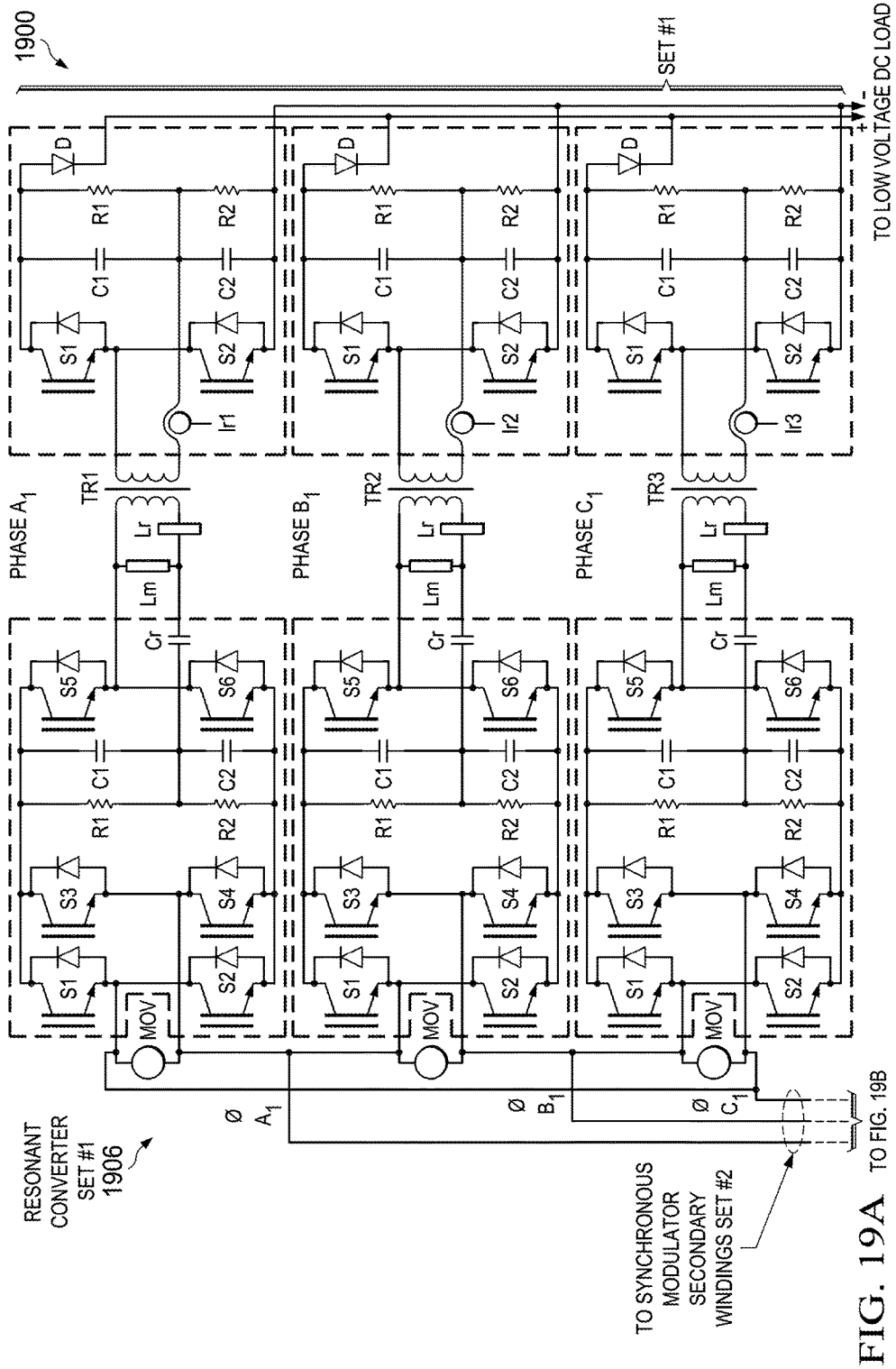
FIGS. 19A and 19B illustrate another example HESM configuration according to this disclosure for production of low-voltage direct current and high voltage direct current outputs for loads with different power requirements.
Figure 19B:
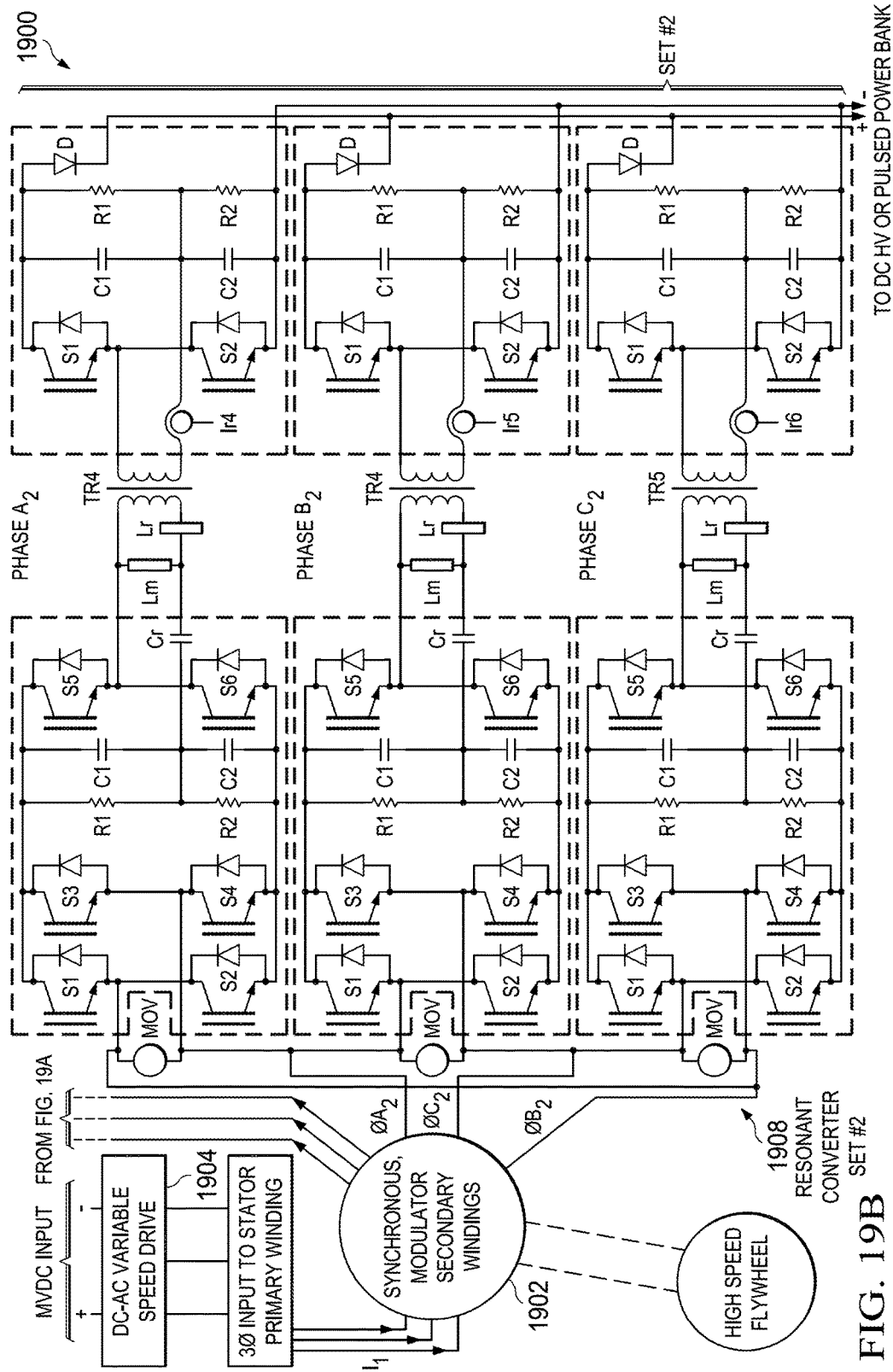

FIGS. 19A and 19B illustrate another example HESM according to this disclosure. The embodiment of the HESM shown is for illustration only. Other embodiments could be used without departing from the scope of the present disclosure.

The HESM can be the same as the RTN HESM described in U.S. patent application Ser. No. 14/591,695 entitled "METHOD AND APPARATUS FOR CONTROL OF PULSED POWER IN HYBRID ENERGY STORAGE MODULE" filed Jan. 7, 2015, the contents of which are hereby incorporated by reference in their entirety.

FIGS. 19A and 19B show a three-port synchronous modulator sub-system 1900 of a two machine system, whereby the input power of SM 1902 is derived from a DC-to-AC frequency converter 1904 and the machine is wound with two polyphase output windings. Output winding 1 (terminals A1, B1, C1) of SM 1902 feeds a set of multiple AC-to-DC resonant power converters 1906 each with a low voltage DC output feeding a battery bank or other LV energy storage device with total galvanic isolation from other subsystems. Output winding 2 (terminals A2, B2, C2) of SM 1902 feeds a set of multiple AC-to-DC resonant power converters 1908 with medium or high voltage DC output and total galvanic isolation from other subsystems. Converters 1908 can charge/discharge a pulse forming network. The resonant frequency and time constants of the resonant power converters 1908 are different from the resonant frequency and time constants of resonant power converters 1906, allowing power to be fed to loads with different input impedances.

In certain embodiments, the synchronous modulator can supply the main power bus through winding No. 1 while simultaneously transmitting power to a pulsed load through Winding No. 2. This electrical machine, as shown in FIG. 15, has two sources of excitation: 1) a rotor DC field winding; and 2) a tertiary stator winding receiving a pulsed 3-phase excitation energy from a pulsed forming network. The electrical machinery shown in FIG. 13 has: 1) a polyphase low frequency AC source feeding "slip" energy to the rotor via slip rings or brushless exciter; and 2) a tertiary stator winding receiving pulsed 3-phase energy from a sequential pulse forming network. Clearly when the synchronous modulator is feeding the main AC bus and the bypass thyristor switches, as shown in FIG. 13, are closed, only the polyphase excitation is viable so as not to create large pulses on the turbine generator grid. When the synchronous modulator is not feeding the main AC bus and the bypass thyristor switches, as shown in FIG. 13, are open, the pulsed AC excitation is most viable for it allows fast rise times for the machine excitation MMF and consequent fast output voltage response.

Certain embodiments of the present disclosure provide an HESM on platforms with up to large, for example, over 32 MW prime power, relies upon a large, such as 2000 MJ, storage system that has both medium rate and fast rate, such as 400 MW/s energy delivery requiring a "buffer" for the lithium-ion battery and the turbine generator set. Certain embodiments of the present disclosure provide a synchronous modulator (rotating machine)+inertial storage concept that permits directed energy power system to be fully bidirectional without causing thermal runaway of large lithium-ion, and similar, battery storage system. Certain embodiments of the present disclosure provide a special reactor that "isolates" a main power system from the pulsed load bus during rapid load changes or pulsing. Certain embodiments of the present disclosure provide and selectively isolate a main ship bus from pulsed load bus according to rate of rise of transient loading and relative levels of transient and sub-transient generator reactance. Certain embodiments of the present disclosure provide a doubly-fed induction machine with multiple output ports that allows multiple voltage levels and multiple time constant to match different types of pulsed power loads for fastest response. Certain embodiments of the present disclosure provide a 1 ms response time controller and power circuitry with redundancy and safety features for large scale HESMs. Certain embodiments of the present disclosure provide unique control modes for a 3-port synchronous modulator/doubly-fed induction machine (DFIM) with high-density lithium battery storage. Certain embodiments of the present disclosure provide a DFIM able to buffer/charge battery, isolate main power & feed pulsed loads. Certain embodiments of the present disclosure provide a DFIM rotating machinery that is bidirectional & minimizes overall power conditioning power by 3:1 factor stator that is directly coupled to all loads without (expensive) frequency converters. For example a 12 MW DFIM output only requires 4 MW power conditioning. Certain embodiments of the present disclosure provide a fast response 3-phase rotor power injection at variable frequency 0.5-20 Hz. Certain embodiments of the present disclosure provide LV winding acts as source & safety buffer to 10 MJ-10,000 MJ lithium battery storage systems. Certain embodiments of the present disclosure provide HV winding feeds pulsed DEPS loads directly or with low-cost AC-DC rectification. Certain embodiments of the present disclosure provide main power converters that are thyristor phase delay rectifiers, not merely bidirectional converters. The HESM System of the present disclosure eliminates large, heavy weight transformer-rectifier converters for large scale power platforms saving tons of weight on mobile applications.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A system, comprising:
an inertial and electro-chemical combined energy storage system;
a first dynamo-electric machine configured to act as a prime mover, the first dynamo-electric machine having output stator windings configured to produce alternating current (AC) power, a rotor winding configured to be excited by an exciter, and at least one polyphase output stator winding with rectification to deliver electric power at a first rate to a bus;

a secondary energy storage system coupled to the bus and configured to exchange electrical energy in a bidirectional manner;

a second dynamo-electric machine, the first dynamo-electric machine electrically coupled to the second dynamo-electric machine through an electrical reactor, the second dynamo-electric machine coupled to the inertial and electro-chemical combined energy storage system and to a third dynamo-electric machine, the third dynamo-electric machine coupled to the inertial and electro-chemical combined energy storage system and configured to impart kinetic energy to and extract kinetic energy from the inertial and electro-chemical combined energy storage system, the second dynamo-electric machine having a multi-port stator winding, a wound-rotor with a polyphase winding for excitation, and at least one polyphase output stator winding coupled to an AC/direct current (DC) power converter, the power converter coupled to a DC output configured to couple to a pulsed load device; and a polyphase boost exciter configured to derive energy from either an AC bus or a DC bus and to excite a second dynamo-electric machine tertiary stator winding, wherein the second dynamo-electric machine is configured to be electrically excited at a second rate that is faster than the first rate in order to feed loads with fast rise times or having rapidly changing terminal impedances.

2. The system as specified in claim 1, wherein the secondary energy storage system comprises an electro-chemical battery.

3. The system according to claim 1, wherein the at least one polyphase output stator winding of the second dynamo-electric machine is configured to deliver fast pulses of electrical energy to the pulsed load device at a plurality of power, duty-cycle, and voltage levels.

4. The system according to claim 1, wherein the system is configured to bi-directionally transfer energy between the DC output, the secondary energy storage system, the inertial and electro-chemical combined energy storage system, and the first dynamo-electric machine.

5. The system according to claim 1, further comprising the electrical reactor positioned in between the first and second dynamo-electric machines, the electrical reactor configured to segregate the first dynamo-electric machine from fast rising pulses or oscillating power profiles operating at the second dynamo-electric machine whilst feeding the pulsed load device.

6. The system according to claim 5, further comprising an electrical polyphase saturable reactor that is controllable by a level of applied DC bias to each of one or more magnetic cores, the level of applied DC bias responsive to at least one of: a load current, an output pulse current, or an output power.

7. The system according to claim 5, wherein the second dynamo-electric machine has a plurality of electrical excitation schemes providing both slowly rising and fast rising output power according to a load demand, the second dynamo-electric machine having a combination of low-impedance and high-impedance polyphase windings configured to produce low-voltage and high-voltage outputs, respectively.

8. The system according to claim 7, wherein the second dynamo-electric machine has a lower transient and sub-transient electrical reactance than the first dynamo-electric machine, thereby diverting a majority of pulsed or transient load current away from the first dynamo-electric machine and reducing an impact of pulse loading on the first dynamo-electric machine.

9. The system according to claim 8, wherein a combination of the second dynamo-electric machine and the third dynamo-electric machine form a network of low electrical impedance to transmit and recover fast rising electrical energy and of substantially lower impedance as compared to the first dynamo-electric machine or the bus.

10. The system according to claim 8, wherein a combination of the second dynamo-electric machine, the third dynamo-electric machine, and the inertial and electro-chemical combined energy storage system form a network with a natural mechanical frequency that is less than a system electrical operating frequency and that avoids electro-mechanical resonances whilst operating the pulsed load device.

11. The system according to claim 10, wherein the second dynamo-electric machine includes (i) one polyphase AC winding connected to the first dynamo-electric machine or the bus through the electrical reactor and (ii) a plurality of polyphase AC windings connected to a plurality of loads comprising both steady-state loads and pulsed loads.

12. The system according to claim 11, wherein the second dynamo-electric machine is configured to transfer incoming AC polyphase power from the first dynamo-electric machine coupled to one stator winding across a machine airgap, magnetize at least one polyphase rotor winding, and transfer power to a converter system connected to a battery energy storage system.

13. The system according to claim 12, wherein the converter system is a bi-directional converter that allows for battery charging power flow and for the battery energy storage system to provide excitation power to the second dynamo-electric machine, the battery charging power flow comprising a combination of power from the first dynamo-electric machine and inertial energy imparted to a rotor of the third dynamo-electric machine.

14. The system according to claim 1, further comprising a control system, the control system comprising:
   an outer speed energy controller loop;
   an inner current regulating loop; and
   an innermost voltage controller configured to direct gating pulses to a power electronic motor drive for regulation of overall system energy.

15. The system according to claim 1, further comprising an excitation controller configured to control synchronous and asynchronous mode of operation of a wound-rotor dynamo-electric machine.

16. The system according to claim 1, further comprising:
   a parallel multi-loop control scheme of an outer loop voltage controller and outer loop current controller;
   a switch configured to switch between the outer loop voltage controller and the outer loop current controller; and
   an inner voltage controller configured to control power electronic switching devices used for battery source regulation to a particular load.

17. The system according to claim 1, wherein the second dynamo-electric machine is connected to a zig-zag phase-shift transformer configured to increase a number of output phases to provide a high pulse number for rectification to a DC output bus.

18. The system according to claim 1, further comprising a plurality of energy storage sets configured to operate in unison to feed a common load, wherein the first and second dynamo-electric machines are maintained in synchronization by common frequency connection on at least one stator port including a controller configured to coordinate rotor excitation variable frequency drives in unison.

19. The system according to claim 1, further comprising:
a regenerative motor drive;
a DC power filter; and
a dynamic braking resistor configured to allow bidirectional power to and from the secondary energy storage system.

20. The system according to claim 1, further comprising a three-level DC to AC power converter with outputs coupled to a step-up transformer and a series connection of secondary wye-delta windings configured to produce high voltage AC and subsequent rectification to high voltage DC to the pulsed load device.

21. The system according to claim 1, wherein the third dynamo-electric machine is configured to provide damping to rotor torsional oscillations occurring during rapid or sustained discharges of electrical energy through the second dynamo-electric machine.

* * * * *